United States Patent
Dozen et al.

(10) Patent No.: US 7,879,654 B2
(45) Date of Patent: Feb. 1, 2011

(54) PAPER INCLUDING SEMICONDUCTOR DEVICE AND MANUFACTURING METHOD THEREOF

(75) Inventors: Yoshitaka Dozen, Tochigi (JP); Tomoyuki Aoki, Tochigi (JP); Hidekazu Takahashi, Tochigi (JP); Daiki Yamada, Tochigi (JP); Kaori Ogita, Tochigi (JP); Naoto Kusumoto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/694,505

(22) Filed: Jan. 27, 2010

(65) Prior Publication Data

US 2010/0126681 A1    May 27, 2010

Related U.S. Application Data

(62) Division of application No. 11/819,157, filed on Jun. 25, 2007, now Pat. No. 7,667,310.

(30) Foreign Application Priority Data

Jun. 26, 2006    (JP) .............................. 2006-175678

(51) Int. Cl.
   *H01L 23/48* (2006.01)
(52) U.S. Cl. ................. 438/123; 257/E23.01
(58) Field of Classification Search ................ 235/492; 438/123; 257/678, E23.01; 340/572.8, 825.3, 340/572, 825; 162/138
   See application file for complete search history.

(56) References Cited

U.S. PATENT DOCUMENTS 5,599,046 A    2/1997    Behm et al.
6,918,535 B1   7/2005    Brosow
7,032,828 B2   4/2006    Krul et al.

(Continued)

FOREIGN PATENT DOCUMENTS

DE    102004018081    10/2005

(Continued)

OTHER PUBLICATIONS

Invitation to Pay Additional Fees (Application No. PCT/JP2007/062654) International Searching Authority dated Jul. 24, 2007.

(Continued)

*Primary Examiner*—Roy K Potter
(74) *Attorney, Agent, or Firm*—Eric J. Robinson; Robinson Intellectual Property Law Office, P.C.

(57) ABSTRACT

Paper embedded with a semiconductor device capable of communicating wirelessly is realized, whose unevenness of a portion including the semiconductor device does not stand out and the paper is thin with a thickness of less than or equal to 130 μm. A semiconductor device is provided with a circuit portion and an antenna, and the circuit portion includes a thin film transistor. The circuit portion and the antenna are separated from a substrate used during manufacturing, and are interposed between a flexible base and a sealing layer and protected. The semiconductor device can be bent, and the thickness of the semiconductor device itself is less than or equal to 30 μm. The semiconductor device is embedded in a paper in a papermaking process.

13 Claims, 19 Drawing Sheets

U.S. PATENT DOCUMENTS

| | | |
|---|---|---|
| 7,452,786 B2 | 11/2008 | Dozen et al. |
| 7,466,233 B2 | 12/2008 | Drapala et al. |
| 7,508,305 B2 | 3/2009 | Yamazaki et al. |
| 7,591,863 B2 | 9/2009 | Watanabe et al. |
| 2005/0141256 A1 | 6/2005 | Yamazaki et al. |
| 2006/0176181 A1 | 8/2006 | Halope |
| 2007/0083381 A1 | 4/2007 | Farrell et al. |

FOREIGN PATENT DOCUMENTS

| | | |
|---|---|---|
| JP | 2001-230269 | 8/2001 |
| JP | 2002-298118 | 10/2002 |
| JP | 2002-319006 | 10/2002 |
| JP | 2006-019717 | 1/2006 |
| JP | 2006-049851 | 2/2006 |
| JP | 2006-060196 | 3/2006 |
| JP | 2006-135305 | 5/2006 |
| WO | WO 2005/119781 | 12/2005 |
| WO | WO 2005/121908 | 12/2005 |

OTHER PUBLICATIONS

International Search Report (Application No. PCT/JP2007/062654) dated Oct. 2, 2007.

Written Opinion (Application No. PCT/JP2007/062654) dated Oct. 2, 2007.

Search Report (Application No. 07767462.0) dated Oct. 22, 2009.

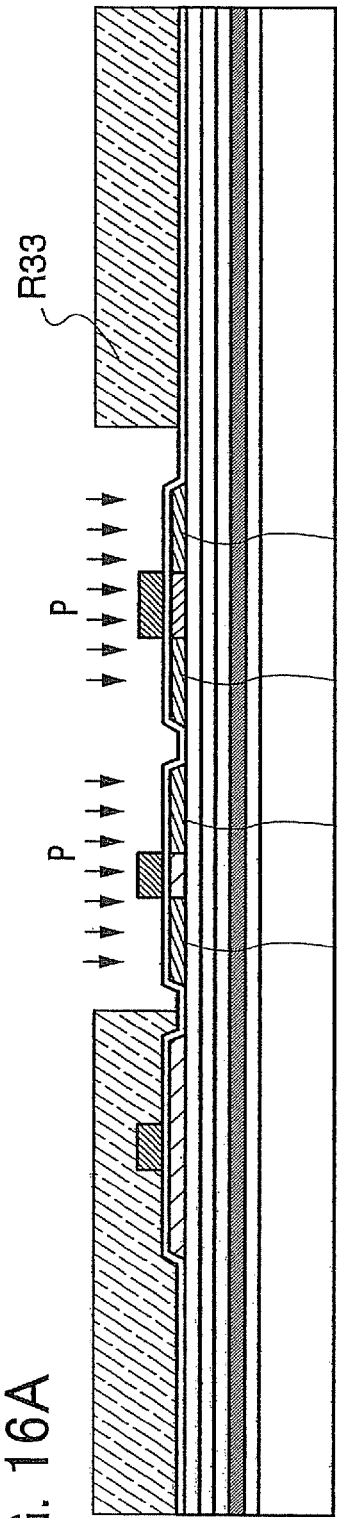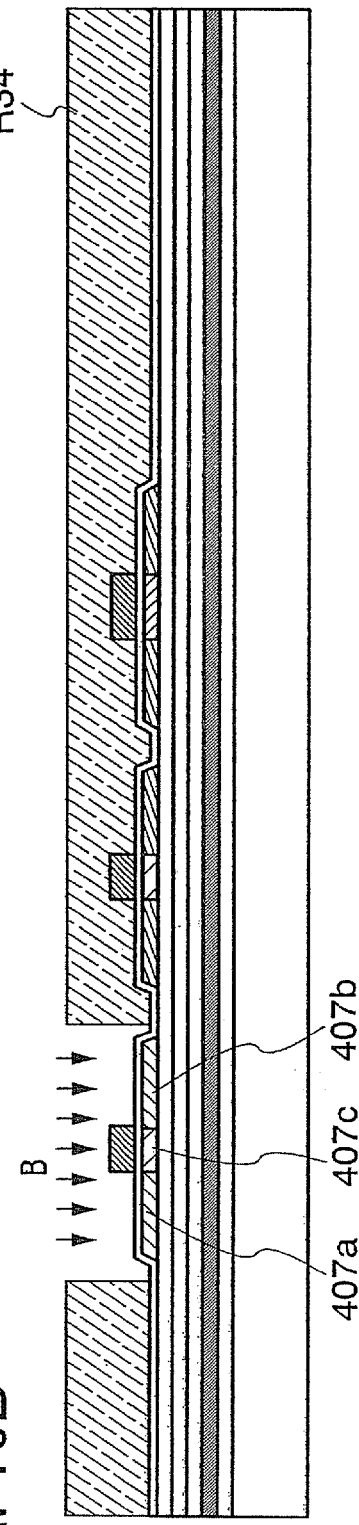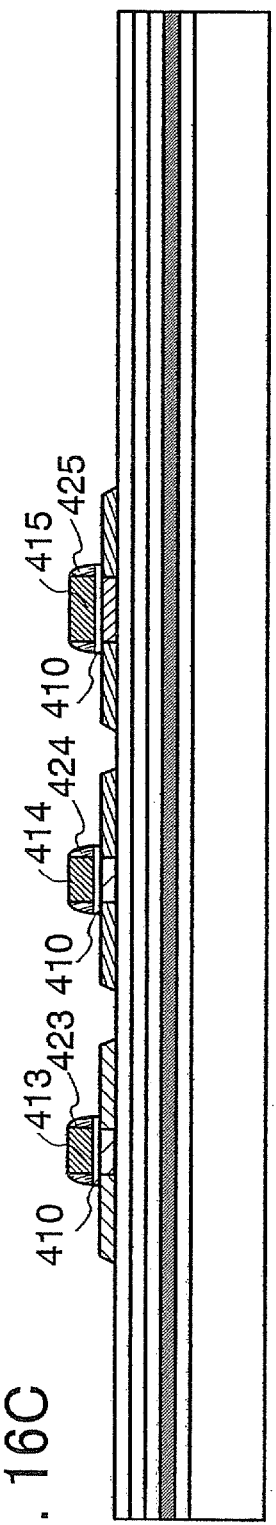
FIG. 16A
FIG. 16B
FIG. 16C

PAPER INCLUDING SEMICONDUCTOR DEVICE AND MANUFACTURING METHOD THEREOF

TECHNICAL FIELD

The present invention relates to paper including a semiconductor device and a manufacturing method of the paper.

BACKGROUND ART

In recent years, individual recognition technology has received a lot of attention. For example, there is a technology to be used for production and management, in which information such as a history of an individual object is clarified by giving an ID (an individual recognition number) to the object. Above all, the development of semiconductor devices that can transmit and receive data without contact has been advanced. As such semiconductor devices, an RFID (Radio Frequency Identification) tag (also referred to as an ID tag, an IC tag, an IC chip, an RF (Radio Frequency) tag, a wireless tag, an electronic tag, or a wireless chip) and the like are beginning to be introduced into companies, markets, and the like.

Further, embedding an IC chip in paper has been suggested, and since incorporating an IC is easy, there is demand for embedding an IC chip in paper in a papermaking process. For example, in Patent Document 1: Japanese Published Patent Application No. 2002-298118, embedding an IC chip between paper layers using a cylinder paper machine is mentioned. Also, in Patent Document 2: Japanese Published Patent Application No. 2001-230269, paper embedded with an IC chip is manufactured by letting the IC chip sink in a raw material of paper that is dissolved in water, and then drying the raw material of paper while applying pressure with a roller.

In Patent Document 1, the IC chip is simply embedded in multilayered paper, and there is no consideration for flatness or flexibility of the portion in which the IC chip is embedded. In Patent Document 2, since an IC chip that is cut out of a silicon wafer is used, flexibility of a portion in which the IC chip is embedded is reduced.

DISCLOSURE OF INVENTION

In view of the foregoing, in providing paper embedded with a semiconductor device, an object of the present invention is to prevent degradation of the original quality of the paper. Further, another object is to embed a semiconductor device in thin paper with a thickness of 130 μm or less, without reducing smoothness of the surface.

In order to solve the foregoing problems, a feature of the present invention is to embed in paper a semiconductor device that is formed by forming a circuit using a thin film transistor, peeling the circuit using a thin film transistor off of a substrate used during manufacturing, and transferring it to another substrate that is flexible. By the semiconductor device having such a structure, flexibility is obtained.

Also, another feature of the present invention is to embed in paper a semiconductor device of which thinness and flexibility are not lost at the same time as securing strength and resistance to water, which are necessary in making paper. Specifics are described below.

In paper according to the present invention, an embedded semiconductor device includes a flexible base, and a stacked-layer body over the flexible base. In the stacked-layer body, an element layer having a circuit including a thin film transistor and an antenna connected to the circuit, and a sealing layer for sealing a surface of the element layer are stacked. By sandwiching the element layer between the flexible base and the sealing layer, the semiconductor device can be made to be thin, as in 30 μm or thinner, at the same time as securing strength and water resistance necessary when manufacturing the paper or when using the paper.

Further, a side surface of the stacked-layer body is formed of stacked layer films of insulating films formed when manufacturing the circuit or antenna, and the sealing layer. That is, the stacked layer films protect the circuit and antenna on the side surface of the stacked-layer body. Such a structure of the side surface of the stacked-layer body can be formed by cutting the element layer together with the sealing layer.

In implementing the present invention, it is preferable that paper is multilayered paper. Therefore, the present invention includes a manufacturing method of paper, and a specific structure is as follows.

In the manufacturing method of paper, a semiconductor device is provided over a first wet paper web, a second wet paper web is laminated over the first wet paper web and the semiconductor device, the first and second wet paper webs are pressed, and the first and second wet paper webs are dried, and the first and second wet paper webs are pressed while an object that can change in shape is in contact with one surface of one of the first and second wet paper webs. For pressing means, a pair of flat plates, a pair of rollers, or the like can be selected. The object that can change in shape may be fixed to the pressing means such as the flat plate, roller, or the like, or not.

Note that a semiconductor device in this specification refers to devices in general that can function by utilizing semiconductor characteristics.

Note that in this specification, "connected" refers to being electrically connected. Accordingly, in a structure disclosed by the present invention, in addition to a predetermined connection relationship, another element (for example, a switch, a transistor, a capacitor, a coil, a resistor, a diode, or the like) that makes electrical connection possible may be placed therebetween.

By implementing the present invention, a semiconductor device can be embedded in paper in a papermaking process, since mechanical strength and water resistance can be secured for a flexible semiconductor device. By embedding a semiconductor device during a papermaking process, it is extremely difficult to take out the semiconductor device without damaging the paper; therefore, paper according to the present invention has a function of preventing counterfeiting. Accordingly, by giving an RFLD function to the semiconductor device, electronic ID information (individual identification information) can be recorded in the paper; consequently, the semiconductor device can be applied to passports, banknotes, securities, cash vouchers, tickets, official documents, contract documents, a variety of documents with highly confidential information (for example, specification documents, lists of names, account ledgers, design drawings, and the like), and a variety of paper media for which counterfeiting prevention is necessary.

Also, since the semiconductor device has a flexible property and a portion surrounding the semiconductor device has high flexibility, there is little restriction on the original function and use of the paper by implementation of the present invention. Further, it is possible to make the thickness of the paper be 130 μm or thinner. Needless to say, implementation of the present invention is not restricted to thin paper. For example, the present invention can be applied to a thick piece of paper with a thickness of 200 μm or more such as ink-jet printing paper for photographs or paper used for certificates.

Also, by implementing a manufacturing method of paper of the present invention, a surface of one of two layers of paper can be formed to be flat without showing unevenness due to a semiconductor device. This is because laminated wet paper webs are pressed while one surface of the laminated wet paper webs is made to be in contact with a rigid body and another surface is made to be in contact with an object that can change in shape.

BRIEF DESCRIPTION OF DRAWINGS

In the accompanying drawings:

FIGS. 16A to 16C are cross-sectional diagrams for describing the manufacturing process (Embodiment 2);

BEST MODE FOR CARRYING OUT THE INVENTION

Embodiment Mode

Embodiment modes and embodiments of the present invention will hereinafter be described with reference to drawings. However, the present invention can be carried out in many different modes, and it is easily understood by those skilled in the art that modes herein disclosed can be modified in various ways without departing from the spirit and the scope of the present invention. Therefore, the present invention should not be interpreted as being limited to the description of the embodiment modes and embodiments to be given below.

<Structure of Paper Embedded with a Semiconductor Device>

First, a structure of paper embedded with a semiconductor device is described. In this specification, as the semiconductor device, a semiconductor device including wireless communication means and provided with an RFID function is taken as an example and described.

Figure 1A:
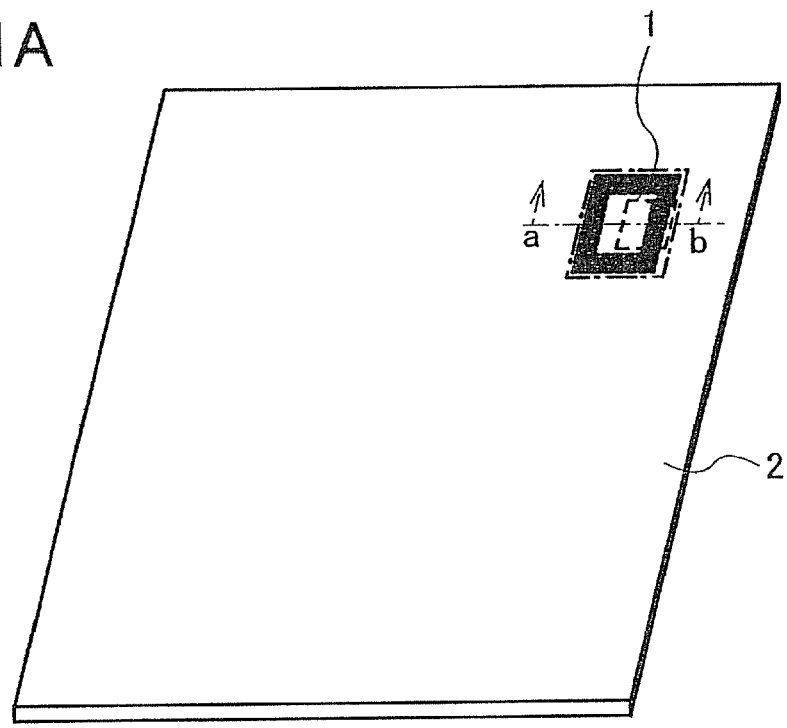
FIGS. 1A to 1C are each a diagram describing paper of the present invention embedded with a semiconductor device.
Figure 1B:
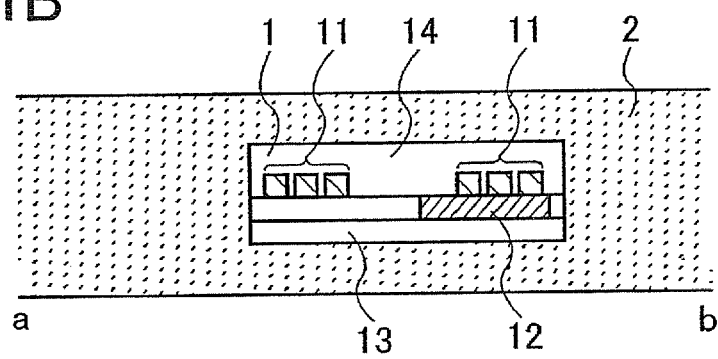
Figure 1C:
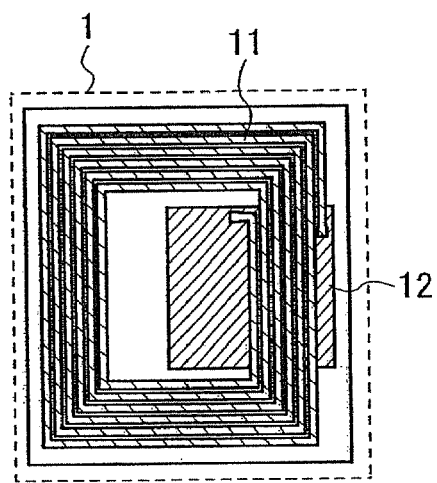

FIG. 1A is a schematic external view of paper embedded with a semiconductor device, and FIG. 1B is a schematic cross-sectional view of the diagram in FIG. 1A along a dotted line a-b. FIG. 1C shows a schematic top view structure of the semiconductor device. As shown in FIG. 1A, a semiconductor device 1 is embedded in paper 2. The semiconductor device 1 includes a circuit for performing wireless communication. The semiconductor device 1 can be made to function as an RF tag.

As shown in FIG. 1C, the semiconductor device 1 includes an antenna 11 for receiving and transmitting a signal, and a circuit portion 12 in which a variety of circuits are integrated, such as a circuit that analyzes the signal received by the antenna 11 and a circuit that generates a power supply from the received signal. As shown in FIG. 1B, a bottom portion (bottom surface) of the circuit portion 12 is supported by a flexible base 13, and a top surface thereof is sealed with a sealing layer 14 along with the antenna 11.

<Structure of Semiconductor Device 1>

Figure 2:
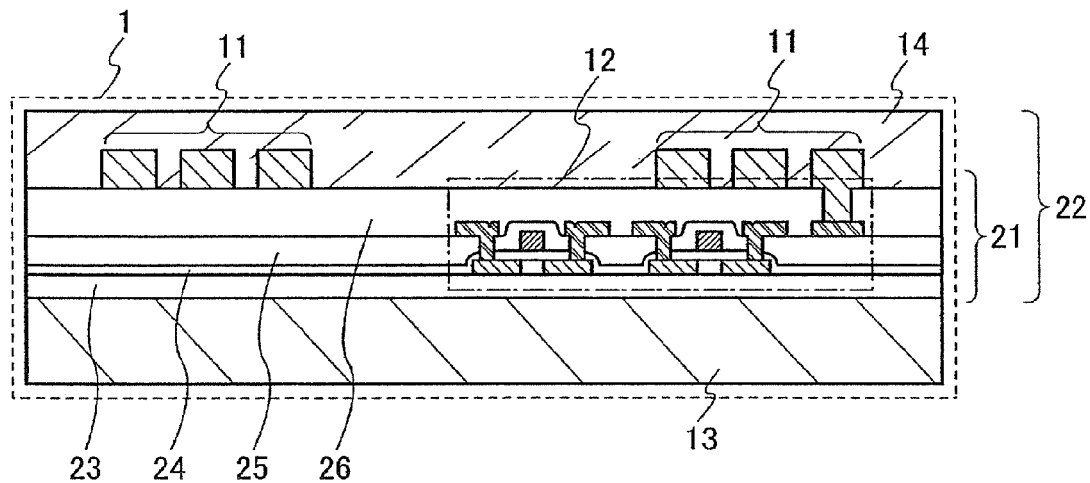
FIG. 2 is a schematic cross-sectional view of a semiconductor device embedded in paper of the present invention.
Figure 3:
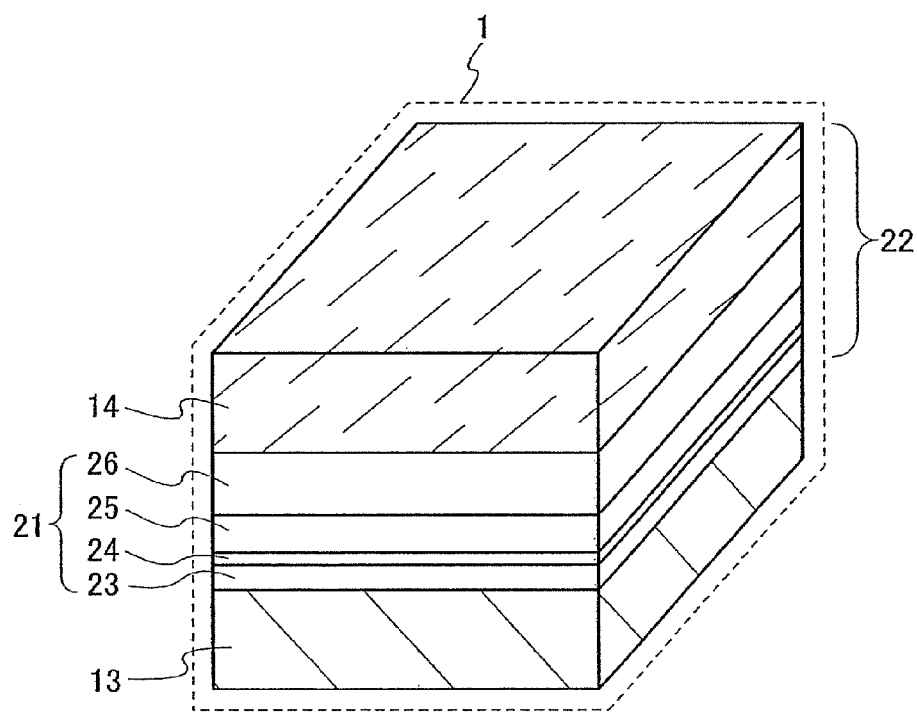
FIG. 3 is a diagram showing an external structure of the semiconductor device.

A structure and a manufacturing method of the semiconductor device 1 are described with reference to FIGS. 2 to 5D. FIG. 2 is a schematic cross-sectional view of the semiconductor device 1, and FIG. 3 is a diagram describing an external view structure of the semiconductor device 1. FIGS. 4A to 5D are cross-sectional diagrams showing the manufacturing method of the semiconductor device 1.

In the semiconductor device 1, an element layer 21 in which the circuit portion 12 and the antenna 11 connected to the circuit portion 12 are stacked, and the sealing layer 14 sealing a surface of the element layer 21 are stacked over the flexible base 13. That is, the element layer 21 has a structure of being sandwiched by the flexible base 13 and the sealing layer 14.

In the circuit portion 12, circuits each using a thin film transistor (hereinafter referred to as "TFT") are integrated. In FIG. 2, the circuit portion 12 is shown by a cross-sectional diagram of two top-gate thin film transistors, as a matter of convenience. A stacked layer structure of the element layer 21 and the sealing layer 14 (hereinafter referred to as a "stacked-layer body 22") stacked over the flexible base 13 is a structure that is transferred to the flexible base 13 from a substrate used during manufacturing.

The element layer 21 is manufactured by a manufacturing process of a thin film transistor. A side surface of the element layer 21 is made of stacked layer films that include insulating films 23 to 26 formed when the antenna 11 and the circuit portion 12 are manufactured. As shown in FIG. 3, in the element layer 21, a bottom portion (as a matter of convenience, a surface that comes to the lower side when the element layer 21 is formed is referred to as the bottom portion) of the antenna 11 and the circuit portion 12 is protected by the flexible base 13, a top surface is sealed by the sealing layer 14, and the side surface is covered by the stacked layer films including the insulating films 23 to 26. By the semiconductor device 1 having such a stacked layer structure, the semiconductor device 1 is thin and flexible at the same time as securing strength and water resistance. The manufacturing method of the semiconductor device 1 is described below with reference to cross-sectional diagrams of FIGS. 4A to 5D.

<Manufacturing Method of Semiconductor Device 1>

A substrate 31 for manufacturing the element layer 21 is prepared. For the substrate 31, a substrate having rigidity necessary in manufacturing a thin film transistor and heat resistance that is enough to withstand a processing temperature is selected. For example, as the substrate 31, a glass substrate, a quartz substrate, a silicon substrate, a metal substrate, or a stainless steel substrate can be used.

A peeling layer 32 is formed over a surface of the substrate 31. The peeling layer 32 is a layer that is formed for peeling the stacked-layer body 22 off of the substrate 31. An insulating film 23 forming a base insulating film of a thin film transistor is formed over a surface of the peeling layer 32. The insulating film 23 can be formed as a single layer film or a multi-layer film using a material selected from silicon oxide, silicon nitride, silicon nitride oxide ($SiO_xN_y$), diamond-like carbon, aluminum nitride (AlN), or the like, to prevent contamination of the circuit portion 12. Such a film can be formed by a CVD method or a sputtering method (see FIG. 4A).

Figure 4A:
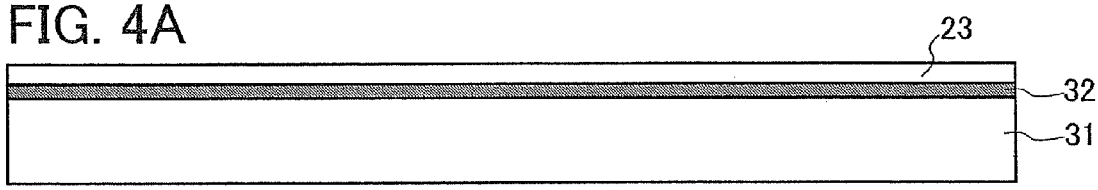
FIGS. 4A to 4F are each a cross-sectional view describing a manufacturing method of the semiconductor device.
Figure 4B:
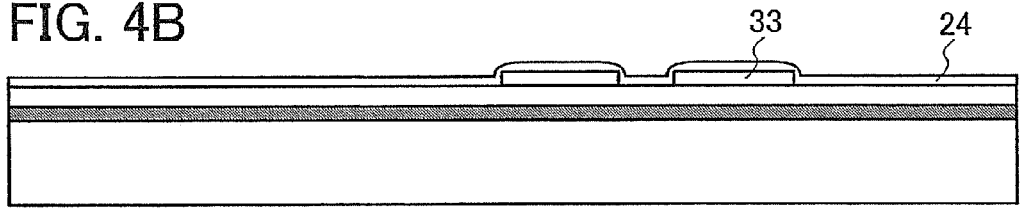

A semiconductor film 33 is formed over the insulating film 23, and an insulating film 24 is formed covering the semiconductor film 33 (see FIG. 4B). The semiconductor film 33 is a semiconductor layer in which a channel formation region and an impurity region of a TFT are formed. In this embodiment mode, the insulating film 24 functions as a gate insulating film since the TFT has a top-gate structure. The insulating film 24 may be a single layer film of silicon oxide or silicon nitride oxide ($SiO_xN_y$) or a multilayer film thereof, with a thickness in a range of 10 nm to 60 nm inclusive. Such an insulating film can be formed by a CVD method or a sputtering method.

The semiconductor film 33 can be formed of silicon, germanium, or a compound of silicon and germanium (silicon-germanium). It is preferable that a crystalline semiconductor film is used as the semiconductor film 33 to form a TFT with high field-effect mobility. To form a crystalline semiconductor film, an amorphous semiconductor film may be formed and then the amorphous semiconductor film may be crystallized with light energy or heat energy.

For example, an amorphous silicon film may be formed by a CVD method using a source gas of silane ($SiH_4$) gas diluted with hydrogen. It may also be formed by a sputtering method using a target including silicon. An amorphous germanium film can be formed by a CVD method using a source gas of germane ($GeH_4$) gas diluted with hydrogen, or, by a sputtering method using a target including germanium. Also, an amorphous silicon germanium film can be formed by a CVD method using a source gas of silane ($SiH_4$) gas and germane ($GeH_4$) gas mixed at a predetermined ratio and diluted with hydrogen, or by a sputtering method using two types of targets of silicon and germanium.

In film forming by a CVD method, helium gas, fluorine gas, or a rare gas of Ar, Kr, Ne, or the like can be added to the source gas instead of hydrogen gas. Also, $Si_2H_6$, $SiH_2Cl_2$, $SiHCl_3$, $SiCl_4$, $SiF_4$, or the like can be used for the source gas instead of silane ($SiH_4$) gas. Further, by a plasma CVD method using any of the foregoing source gases, a crystalline semiconductor film can be formed over the insulating film 23.

As a method of crystallizing the amorphous semiconductor film, a method of irradiation with laser light, a method of irradiation with infrared radiation or the like, a method of heating in an electrical furnace, a method of adding an element promoting crystallization of a semiconductor and then heating for crystallization, or the like can be given.

As a laser beam used for crystallization, a laser beam from either a continuous wave laser (CW laser) or a pulsed oscillation laser (pulsed laser) can be used. As a gas laser favorable for crystallization, an Ar laser, a Kr laser, an excimer laser, or the like is given. As a solid-state laser, a glass laser; a ruby laser; an alexandrite laser; a Ti:sapphire laser; a laser using as a medium a crystal of YAG, $YVO_4$, $YAlO_3$, $GdVO_4$, forsterite ($Mg_2SiO_4$), or the like containing a dopant (for example, Nd, Yb, Cr, Ti, Ho, Er, Tm, or Ta); or the like is given.

An amorphous semiconductor can be crystallized by irradiation with not only a fundamental wave of a beam emitted from such a laser, but any of second to fourth harmonics thereof. For example, a second harmonic (532 nm) or a third harmonic (355 nm) of a $Nd:YVO_4$ laser (fundamental wave 1064 nm) can be used. Energy density of the laser needs to be within a range of 0.01 $MW/cm^2$ to 100 $MW/cm^2$ inclusive, preferably within a range of 0.1 $MW/cm^2$ to 10 $MW/cm^2$ inclusive. Scanning speed may be in a range of 10 cm/sec to 200 cm/sec inclusive.

A solid-state laser using as a medium the foregoing crystal of YAG or the like, an Ar ion laser, and the Ti:sapphire laser can oscillate continuously. By a Q switch operation, mode locking, or the like, pulse oscillation at a repetition rate of 10 MHz or more is also possible. When a laser beam is oscillated at a repetition rate of 10 MHz or more, in the time it takes for a semiconductor film to be melted by a laser beam and then hardens again, the semiconductor film is irradiated with a subsequent pulse. As opposed to when a pulsed laser with a low repetition rate is used, by scanning a laser beam, a solid-liquid interface caused by laser beam irradiation can be moved continuously; consequently, crystal grains that grow long in a scanning direction can be obtained.

Further, instead of the laser, by irradiation with infrared light, visible light, or ultraviolet light with a lamp as a light source, the amorphous semiconductor film can also be crystallized. In this case, one of infrared light, visible light and ultraviolet light or a combination thereof can be used. In this case, as the lamp, a halogen lamp, a metal halide lamp, a xenon arc lamp, a carbon arc lamp, a high-pressure sodium lamp, or a high-pressure mercury lamp is typically used. Lighted time of the lamp is to be 1 to 60 seconds inclusive, preferably 30 to 60 seconds inclusive, and light irradiation with the lamp is carried out 1 to 10 times inclusive, preferably 2 to 6 times inclusive. Light emission intensity of the lamp is set appropriately depending on a material of the amorphous semiconductor, film thickness, or the like; for example, the semiconductor film is instantly heated at a heating temperature of 600° C. to 1000° C. inclusive.

A method of crystallization using an element that promotes crystallization of the amorphous semiconductor film is favorable for crystallizing an amorphous silicon film. By introducing an element that promotes crystallization into the amorphous silicon film and then subjecting the amorphous silicon film to laser beam irradiation or a heat treatment at 500° C. to 600° C., crystalline silicon with high continuity of crystal grains in a grain boundary can be obtained. As the element that promotes crystallization of silicon, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

There is no particular limitation to a way of introducing such an element into the amorphous silicon film, as long as it is a technique that can make the element exist on a surface of the amorphous silicon film or inside of the amorphous silicon film. For example, a sputtering method, a CVD method a plasma treatment method (including a plasma CVD method), an adsorption method, or a method of applying a solution of a metal salt, can be used. Among these, a method using a solution is convenient, and adjusting a concentration of the element to be introduced into the amorphous silicon film is easy. When applying the solution, wettability of a surface of the amorphous silicon film is preferably improved so that the solution is spread over an entire surface of the amorphous silicon film. To improve the wettability, it is desirable to form an extremely thin oxide film with a thickness of 10 nm or less on the surface of the amorphous silicon film. To form the extremely thin oxide film, UV light irradiation in an oxygen atmosphere, a treatment according to a thermal oxidation method, a treatment with hydrogen peroxide, a treatment with ozone water containing a hydroxyl radical, or the like can be performed.

Since the element that is used in crystallization degrades a characteristic of an element such as a TFT, the introduced element is desirably removed from the silicon film after crystallization. A method thereof is described below.

First, by treating the surface of a crystalline silicon film with an aqueous solution containing ozone (typically, ozone water), a barrier layer including an oxide film (called a chemical oxide) is formed with a thickness of 1 nm to 10 nm inclusive on the crystalline semiconductor film. The barrier layer functions as an etching stopper when only a gettering layer is selectively removed in a later step.

Next, a gettering layer containing a rare gas element is formed over the barrier layer as a gettering site. Here, a semiconductor film containing a rare gas element is formed by a CVD method or a sputtering method as the gettering layer. When the gettering layer is formed, a condition of sputtering is appropriately adjusted so that the rare gas element is added to the gettering layer. As the rare gas element, one or a plurality selected from helium (He), neon (Ne), argon (Ar), krypton (Kr), and xenon (Xe) can be used. Note that when gettering, since a metal element (for example, nickel) tends to move to a region with high oxygen concentration, the oxygen concentration of the gettering layer is desirably $5 \times 10^{18}$ m$^{-3}$ or more, for example.

Next, the crystalline silicon film, the barrier layer, and the gettering layer are subjected to a heat treatment (for example, a heating treatment or an irradiation treatment with intense light such as a laser beam or the like) to perform gettering of the introduced element (for example, nickel), and the element is removed from the crystalline silicon film and the concentration of the element in the crystalline silicon film is lowered.

Figure 4C:
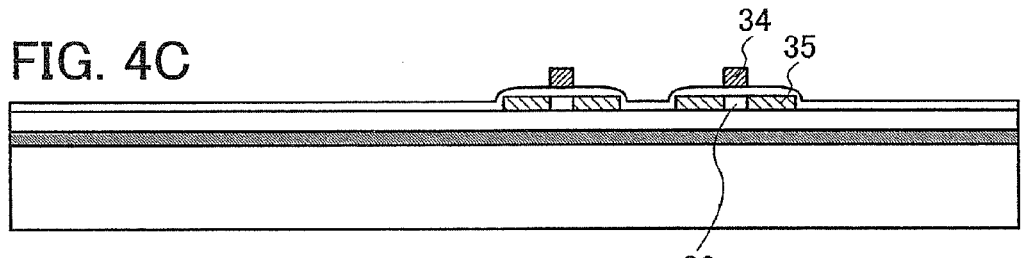

As shown in FIG. 4C, a first conductive layer 34 is formed over the insulating film 24. Here, only a gate electrode of a TFT is shown in the figure as the first conductive layer 34. Also, an impurity is added to the semiconductor film 33 to form an n-type or p-type impurity region 35 that functions as a source region or drain region. The addition of the impurity can be done before or after forming the first conductive layer 34. Alternatively, it can be done both before and after forming the first conductive layer 34. By the impurity region 35 being formed, a channel formation region 36 is also formed in the semiconductor film 33.

A conductive film forming the first conductive layer 34 may be a single layer conductive film or a multilayer conductive film. For the conductive film, a film including a metal containing an element selected from tantalum (Ta), tungsten (W), titanium (Ti), molybdenum (Mo), aluminum (Al), copper (Cu), and chromium (Cr); a film including an alloy combining such elements; or a film including a nitride of the element can be used, for example. Also, germanium, silicon, a compound of silicon and germanium, or the like that gains conductivity by being added with phosphorus or the like as a dopant can be used. For example, the first conductive layer 34 can be formed of a multilayer film including tantalum nitride (TaN) in a first layer and tungsten (W) in a second layer. These conductive films can be formed by a sputtering method, an evaporation method, a CVD method, or the like.

Figure 4D:
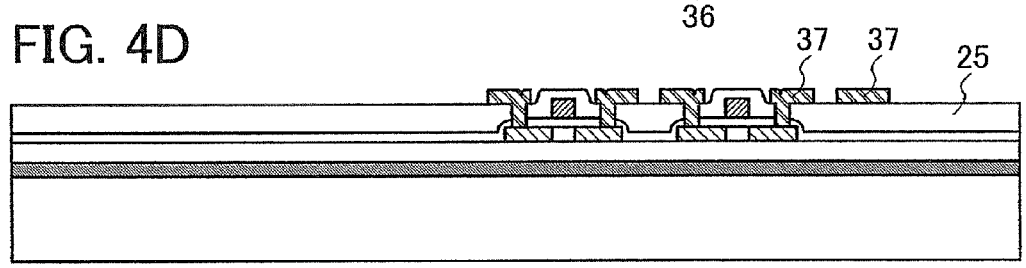

As shown in FIG. 4D, an insulating film 25 is formed over an entire surface of the substrate 31. A second conductive layer 37 is formed over the insulating film 25. The insulating film 25 is an interlayer film that separates the first conductive layer 34 and the second conductive layer 37. As the insulating film 25, an inorganic insulating film of silicon oxide, silicon nitride, silicon oxynitride (SiO$_x$N$_y$), or the like can be used. Also, an organic resin film of polyimide, acrylic, or the like, or a film containing siloxane can be used. The organic resin may be either photosensitive or non-photosensitive. The insulating film 25 may be a single-layer structure of such an insulating material or a multilayer structure thereof. For example, a first layer is an inorganic insulating film containing silicon nitride and a second layer is an organic resin film of polyimide or the like. Note that siloxane is a material having a skeleton structure including a bond between silicon (Si) and oxygen (O), and an organic group (for example, an alkyl group or aromatic hydrocarbon) is used for a substituent. Further, a fluoro group may be included in the substituent.

As shown in FIG. 4D, the second conductive layer 37 forms a wiring, an electrode, and the like of the circuit portion 12. Here, only a wiring connected to a TFT and a terminal portion for connecting the antenna 11 with the circuit portion 12 are shown in the figure. Also, before forming the second conductive layer 37, a contact hole is formed in the insulating films 24 and 25 to connect the second conductive layer 37 with the first conductive layer 34 and the semiconductor film 33 in lower layers.

The second conductive layer 37 may be a single-layer conductive film or a multi-layer conductive film. For example, a film including a metal containing an element selected from tantalum (Ta), tungsten (W), titanium (Ti), molybdenum (Mo), aluminum (Al), copper (Cu), and chromium (Cr); a film including an alloy combining such elements; or a film including a nitride of the element can be used as the conductive film.

Figure 4E:
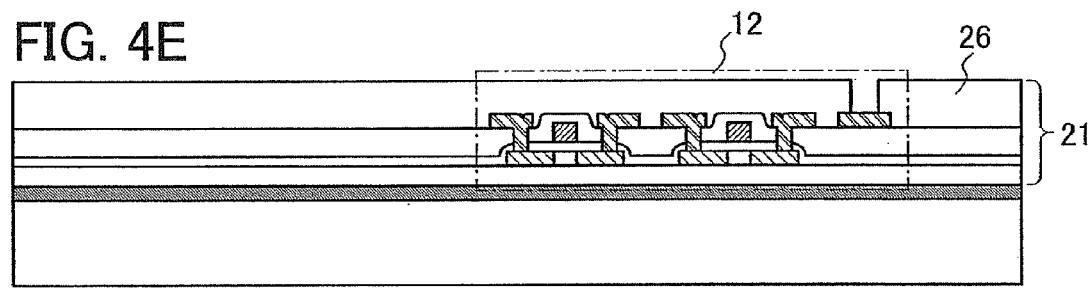

As shown in FIG. 4E, an insulating film 26 is faulted to stack the antenna 11 over the circuit portion 12. The insulating film 26 is preferably formed as a flattening film with which a flat surface can be formed by smoothing out unevenness caused by the circuit portion 12. Accordingly, it is preferable to use a film containing siloxane, or an organic resin film of polyimide, acrylic, or the like, which can be formed by applying or printing a material and then curing this material. Also, instead of a single layer structure, the insulating film 26 can have a multilayer structure with such an organic resin film or the like as an upper layer and an inorganic insulating film of silicon oxide, silicon nitride, silicon oxynitride (SiO$_x$N$_y$), or the like as a lower layer.

Accordingly, the circuit portion 12 is formed in the element layer 21. Note that in the circuit portion 12, a resistor, a capacitor, and the like are manufactured at the same time as a TFT. The thickness of the circuit portion 12 can be formed to be thin, about 3 µm to 5 µm. Note that a structure of the TFT in the circuit portion 12 is not limited to the structure in FIG. 4E. For example, the TFT in the circuit portion 12 can have a multi-gate structure in which a plurality of gates are provided for one semiconductor layer. Also, a high resistance region that is like a low concentration impurity region can be formed adjacent to a channel formation region in the semiconductor layer. Furthermore, the structure may be a bottom-gate structure instead of a top-gate structure.

Figure 4F:
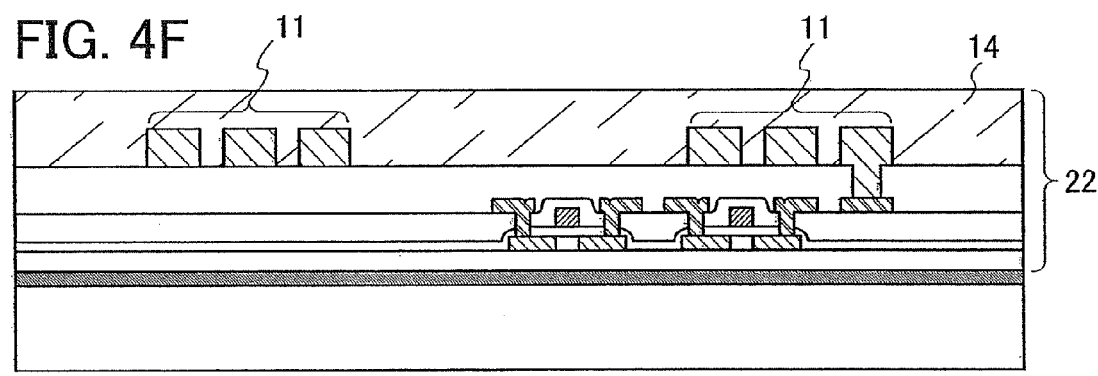

As shown in FIG. 4F, the antenna 11 is formed over the insulating film 26. The antenna 11 can be formed by a method of forming a conductive film by a sputtering method or an evaporation method and then processing the conductive film into a desired shape by etching, or by a method that does not use etching such as a screen printing method or a droplet discharging method. A thinner antenna 11 can be manufactured by the former method. For the antenna 11, copper, silver, gold, aluminum, titanium, or the like may be used. A manufacturing method is not particularly restricted, and a sputtering method, a screen printing method, a droplet discharging method, or the like can be used.

After forming the antenna 11, as shown in FIG. 4F, the sealing layer 14 is formed for sealing a surface of the element layer 21. The sealing layer 14 is formed to suppress damage to the element layer in a peeling step described later and to protect the element layer from a papermaking process. For the sealing layer 14, it is preferable to select a material of which a fowling method is convenient. As a material fulfilling all of these requirements, a resin is preferably used to form the sealing layer 14. As the resin used for the sealing layer 14, for example, a resin such as a thermosetting resin or a light curable resin (UV curable resin, visible light curable resin) is preferable, and an epoxy resin can be given as a material of the resin.

By using an epoxy resin for the sealing layer 14, flatness of a surface of the sealing layer 14 is improved, damage to the element layer 21 can be suppressed and the element layer can be protected against dust or the like in a later peeling step or papermaking step.

Accordingly, manufacturing of the stacked-layer body 22 using the substrate 31 is completed. Note that although only one antenna 11 and one circuit portion 12 are shown in the figures, many antennae 11 and circuit portions 12 are actually manufactured at the same time over the substrate 31.

Next, the stacked-layer body 22 is transferred to the flexible base 13, and the semiconductor device 1 is completed. Steps below are described with reference to FIGS. 5A to 5D.

Figure 5A:
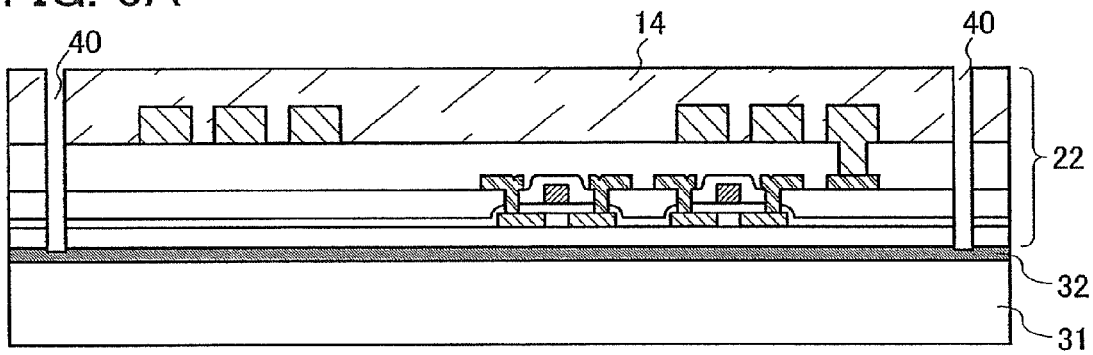
FIGS. 5A to 5D are each a cross-sectional view describing a manufacturing method of the semiconductor device.

First, as shown in FIG. 5A, an opening portion 40 is formed to separate the stacked-layer body 22 from the substrate 31. The opening portion 40 is formed to reach the peeling layer 32 or to penetrate through the peeling layer 32. As a forming method of the opening portion 40, a method in which the stacked-layer body 22 is physically cut with a dicer, a wire saw, or the like; a method in which the stacked-layer body 22 is cut by laser ablation using laser beam irradiation; or a method in which the opening portion 40 is fowled by etching, can be employed. Among these, the cutting method by laser ablation is preferable since there is less damage to the antenna 11 and the circuit portion 12 compared to the other methods.

Also, by forming the opening portion 40, a side surface of the stacked-layer body 22 is formed (refer to FIG. 3 for a structure of the side surface). As shown in FIG. 3, the side surface of the stacked-layer body 22 is composed of stacked layer films of the insulating films 23 to 26 formed when the element layer 21 is manufactured, and the sealing layer 14. Also, since the stacked-layer body 22 is cut together with the sealing layer 14, a side surface of the stacked layer films composed of the insulating films 23 to 26 can be formed to be aligned with a side surface of the sealing layer 14.

Figure 5B:
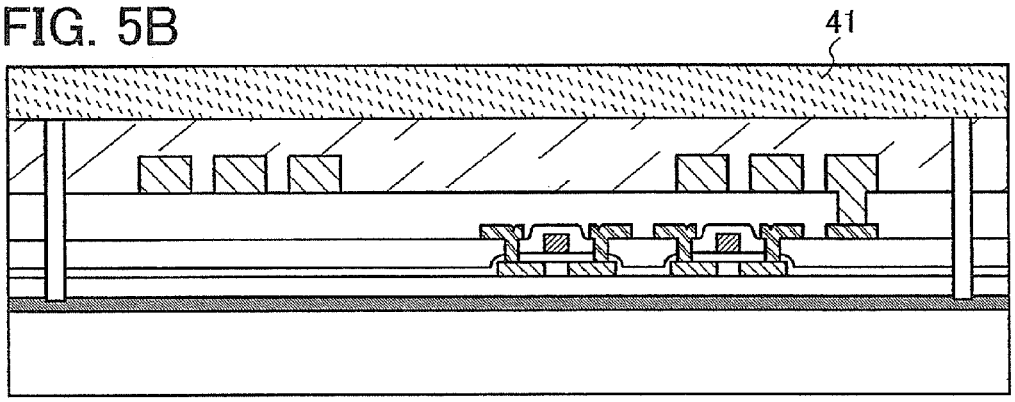

Next, as shown in FIG. 5B, a supporting base 41 is attached to a top surface of the sealing layer 14. The supporting base 41 is a base for supporting the stacked-layer body 22 until the stacked-layer body 22 is transferred to the flexible base 13. Accordingly, a base that can easily be removed from the stacked-layer body 22 is selected for the supporting base 41. For example, for the supporting base 41, a base having a property in which adhesion is strong in a normal state but becomes weak when heat is applied or is irradiated with light, may be used. For example, a thermal peeling tape of which adhesion becomes weak by heating, a UV peeling tape of which adhesion becomes weak by ultraviolet irradiation, or the like may be used. Alternatively, a weak adhesion tape with weak adhesion in a normal state, or the like can be used.

Then, bonding force of a molecule inside the peeling layer 32 or at an interface between the peeling layer 32 and a layer in contact therewith is weakened. Accordingly, by applying force to the supporting base 41, the stacked-layer body 22 can be separated from the substrate 31.

As a method of weakening the bonding force of the molecule inside the peeling layer 32 or the like, there is a method of fanning in advance a portion in the peeling layer 32 where the bonding force of the element is weak, or a method of forming the peeling layer 32 and then treating it so that the bonding force of the molecule becomes weak.

In the former method, a metal layer (Ti, Al, Ta, W, Mo, Cu, Cr, Nd, Fe, Ni, Co, Ru, Rh, Pd, Os, Ir) is formed as the peeling layer, and then an oxide layer of the metal layer is stacked thereon. As a result, the portion where the bonding force of an atom is weak can be formed.

The oxide layer can be formed by oxidizing a surface of the metal layer. For example, by performing a thermal oxidation treatment, an oxygen plasma treatment, an oxidation treatment with a solution having strong oxidizing power such as ozone water, or the like, the oxide layer can be formed. Further, the surface of the metal layer can also be oxidized by forming an insulating film containing oxygen, such as silicon oxide or silicon oxynitride on the surface of the metal layer.

As the latter method of weakening the bonding force of the molecule after forming the peeling layer 32, there is a method of irradiation with a laser beam. For example, amorphous silicon containing hydrogen is used for the peeling layer 32. By irradiating the amorphous silicon with a laser beam, a space is formed because the contained hydrogen is released, which can weaken the peeling layer 32.

Also, a method in which the peeling layer 32 is subjected to wet etching or dry etching can be employed. In this case, the peeling layer 32 may be formed of a metal such as W, Mo, Nb, or Ti; an alloy thereof; a metal compound thereof (for example, an oxide or a nitride); silicon; or the like. Further, a gas or liquid containing halogen fluoride can be used for an etchant. For example, chlorine trifluoride ($ClF_3$), nitrogen trifluoride ($NF_3$), bromine trifluoride ($BrF_3$), and hydrogen fluoride (HF) are given. Note that the etching treatment is performed on the peeling layer 32 before the supporting base 41 is attached.

Further, by forming the opening portion 40 as shown in FIG. 5A, a shrinking force of the sealing layer (resin layer) 14 is applied to the peeling layer 32, which can promote peeling at an interface between the peeling layer 32 and the insulating film 23 or inside the peeling layer 32.

IC chips made of a silicon wafer are formed by forming a plurality of integrated circuits over a silicon wafer, cutting the silicon wafer to fowl a plurality of IC chips, and then sealing each IC chip with a molding agent. On the other hand, in the present invention, the stacked-layer body 22 is sealed with the sealing layer 14 before it is cut into individual RF tags. This is because the sealing layer 14 functions as a protection layer when dividing the stacked-layer body 22, as well as because a trigger is formed for the stacked-layer body 22 to peel off of the substrate 31 by cutting the element layer 21 together with the sealing layer 14. Dividing the element layer 21 together with the sealing layer 14 in this manner is one of the key points of the present invention.

A structure of the side surface of the stacked-layer body 22 is a result of such a process, and the side surface of the stacked-layer body 22 is a surface formed when the sealing layer 14 and the element layer 21 are cut, and the surface is formed so that a side surface of the element layer 21 and a side surface of the sealing layer 14 are aligned with each other. Also, as a result of forming the opening portion 40, the side surface of the stacked-layer body 22 is formed of stacked layer films of the insulating films 23 to 26 formed when manufacturing the antenna 11 and the circuit portion 12, and the sealing layer 14. With these stacked layer films, the antenna 11 and the circuit portion 12 are protected from shock and moisture.

Figure 5C:
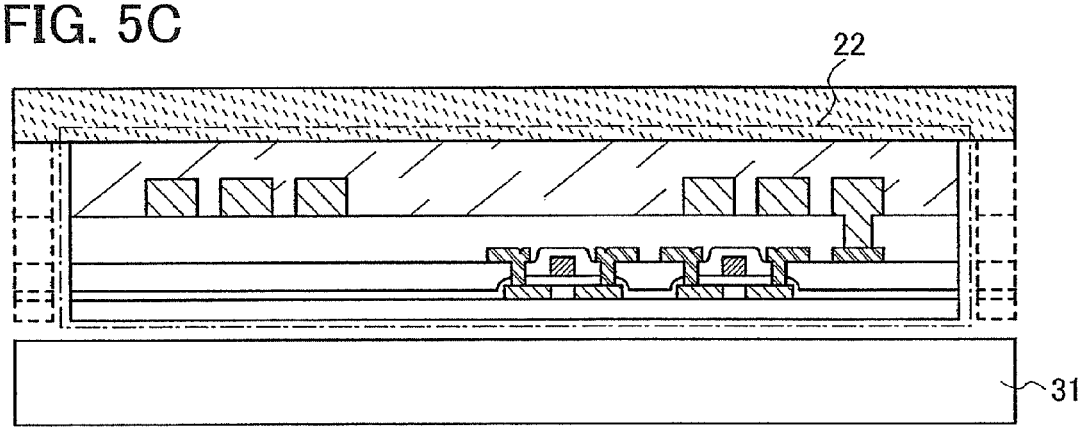
Figure 5D:
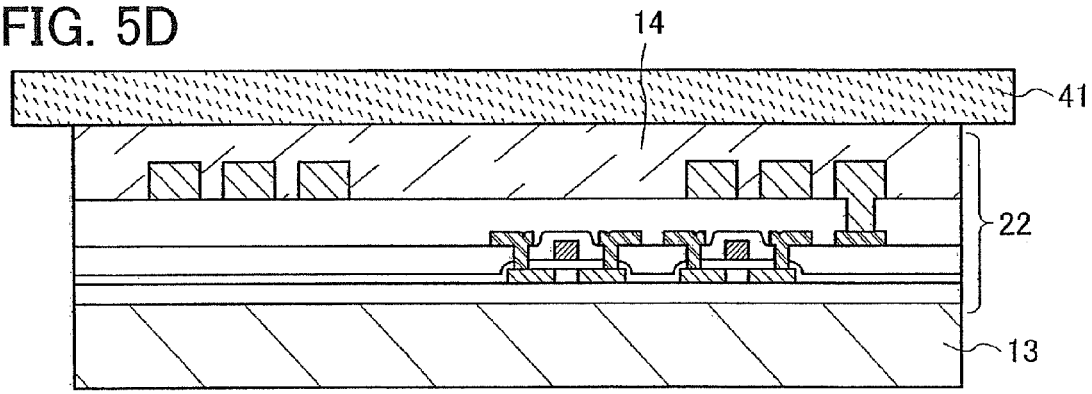

As shown in FIG. 5C, by separating the substrate 31 off of the stacked-layer body 22, the stacked-layer body 22 that is divided to separate each semiconductor device 1 from one other is formed. Next, as shown in FIG. 5D, the flexible base 13 is fixed to a bottom portion of the stacked-layer body 22 (bottom portion of the element layer 21) from which the substrate 31 is peeled. The flexible base 13 has a stacked-layer structure of a base film and an adhesion layer. The base film is made of a resin material (such as polyester, polypropylene, polyvinyl chloride, polystyrene, polyacrylonitrile, polyethylene terephthalate, or polyamide). For an adhesive synthetic resin film, an acrylic resin, an epoxy resin, a vinyl acetate resin, a vinyl copolymer resin, a urethane resin, or the like can be used. Among these, a thermoplastic resin, a curable resin, or a light curable resin that cures by UV light or visible light irradiation is preferably selected.

Finally, the supporting base 41 is peeled off of the stacked-layer body 22. Accordingly, the semiconductor device 1 shown in FIGS. 2 and 3 is completed. As shown in FIG. 3, a top surface of the semiconductor device 1 is protected by the sealing layer 14. By providing the sealing layer 14, protection by the flexible base 13 is not necessary as it is with the bottom portion. Therefore, the semiconductor device 1 is made to be thin easily. The thickness of the sealing layer 14 is made so that it is at least about 20% to 30% thicker than the thickness of the antenna 11. The sealing layer 14 has sufficient mechanical strength for protecting the antenna 11 and the circuit portion 12, as well as secure smoothness of the top surface of the semiconductor device 1.

Further, the bottom portion of the semiconductor device 1 is covered by the flexible base 13. The flexible base 13 has a function of smoothing a surface of the stacked-layer body 22 from which the substrate 31 used when manufacturing the stacked-layer body 22 is removed. For the flexible base 13, a thin base with a base film that has a thickness of 2 μm or more can be used, with which the total thickness (total thickness of the base film and the adhesion layer) of the of flexible base 13 is less than or equal to 20 μm.

Note that a surface of the base film of the flexible base 13 may be coated with silicon dioxide (silica) powder. By coating the surface with the silicon dioxide powder, a waterproof property can be maintained even in a high temperature and high humidity environment. Also, the surface of the base film may be coated with a conductive material such as indium tin oxide. By the coating material, accumulation of charge on the base film can be prevented, and the circuit portion 12 can be protected from static electricity. Further, the surface may be coated with a material mainly containing carbon (for example, diamond-like carbon). Strength is increased by the coating, which can suppress degradation or destruction of the semiconductor device.

The side surface of the stacked-layer body 22 is formed of stacked layer films including the stacked layer films of the insulating films 23 to 26 formed when manufacturing the stacked-layer body 22, and the sealing layer 14. That is, by composing a surface of the semiconductor device 1 with the flexible base 13, the insulating films 23 to 26, and the sealing layer 14, mechanical strength and water resistance necessary for the semiconductor device 1 in a papermaking process can be secured, as well as make the semiconductor device 1 thin, as in less than or equal to 30 μm. In research by the present inventors, manufacturing of the flexible semiconductor device 1 with a thickness of 30 μm or less using a circuit including a thin film transistor has been successful.

Figure 6A:
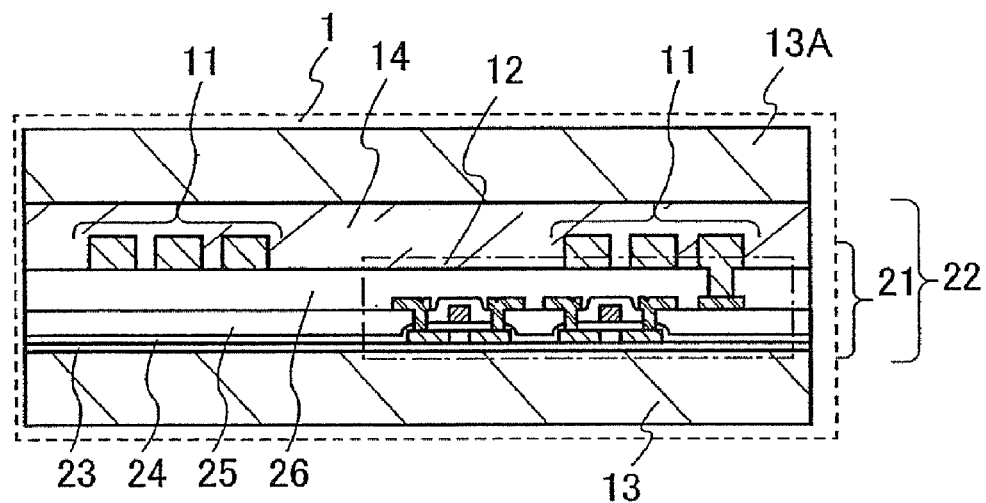
FIGS. 6A and 6B are each a cross-sectional view showing another structural example of a semiconductor device embedded in paper of the present invention.
Figure 6B:
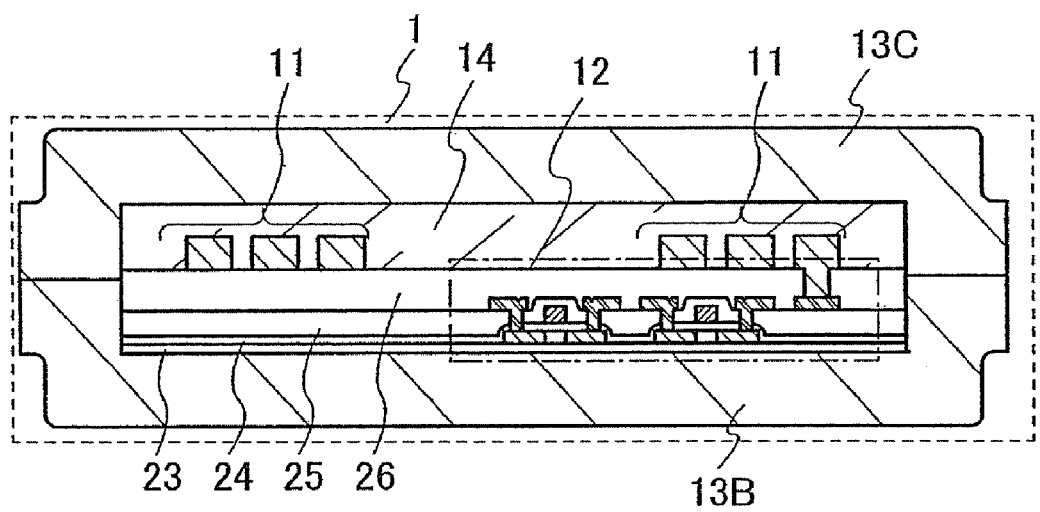

Note that the mechanical strength and water resistance of the semiconductor device 1 can be improved by attaching another flexible base 13 on the top surface of the sealing layer 14. FIGS. 6A and 6B are cross-sectional diagrams of the semiconductor device 1 showing examples of such a structure. As shown in FIG. 6A, in a similar manner to attaching the flexible base 13 to a bottom portion of the element layer 21, a flexible base 13A is provided on the top surface of the sealing layer 14. Also, as shown in FIG. 6B, not only the bottom surface and the top surface but also side surfaces of the stacked-layer body 22 can be sealed, using a pair of flexible bases 13B and 13C.

In a similar manner to the flexible base 13, for each of the flexible bases 13A, 13B, and 13C, a thin base with a base film that has a thickness of 2 μm or more can be used, with which the total thickness of the flexible base (total thickness of the base film and the adhesion layer) is less than or equal to 20 μm. By selecting a flexible base with such a thickness, even when two flexible bases are used, the thickness of the semiconductor device 1 can be made to be 50 μm or less, or even thinner, as in 40 μm or less.

Figure 7A:
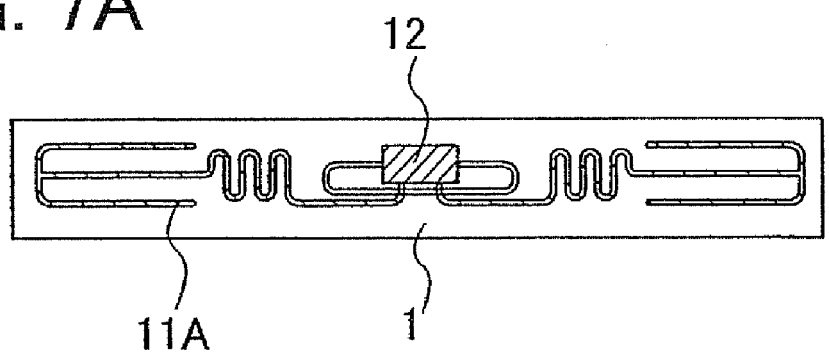
FIGS. 7A to 7C are each a diagram showing a structural example of an antenna.
Figure 7B:
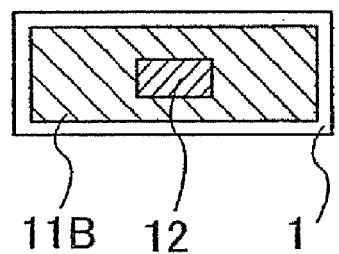
Figure 7C:
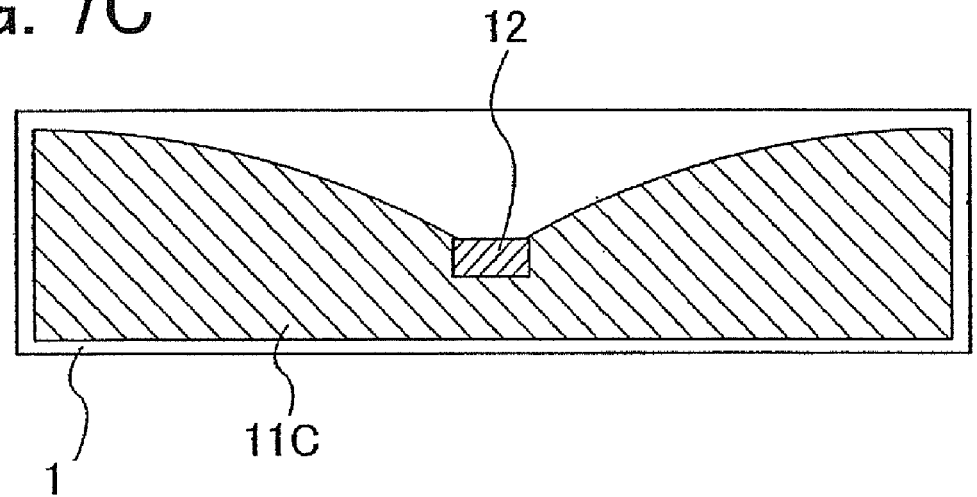
Figure 8A:
FIGS. 8A to 8D are each a cross-sectional diagram describing a method of embedding a semiconductor device in paper.
Figure 8B:
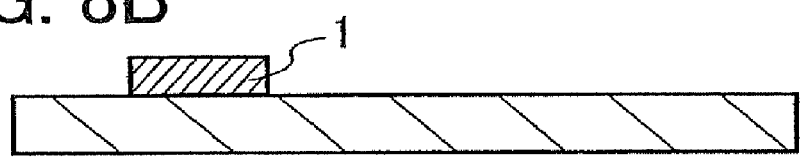
Figure 8C:
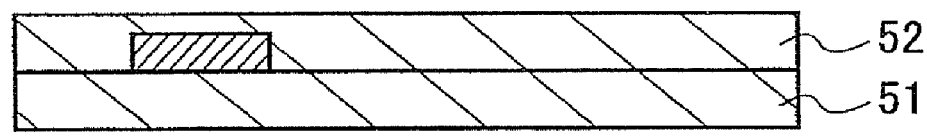
Figure 8D:
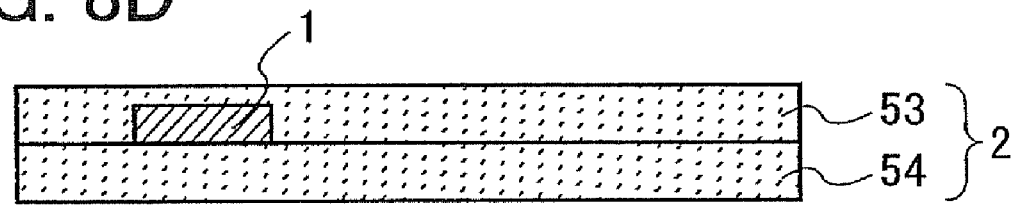

Note that the antenna 11 of the semiconductor device 1 shown in FIGS. 1A to 1C is an antenna of a spiral structure, but an antenna of another structure can be used. For example, an antenna 11A of a linear form such as a dipole antenna can be used as shown in FIG. 7A. Also, as shown in FIG. 7B, an antenna 11B that is a flat rectangular solid (such as a patch antenna) can be used. Further, an antenna 11C of a ribbon form can be used as shown in FIG. 7C. Length, shape, size, and the like of the antenna are appropriately selected depending on communication range or the like of the semiconductor device 1.

<Manufacturing Method of Paper>

Next, a method of embedding the semiconductor device 1 in paper is described with reference to the cross-sectional diagrams shown in FIGS. 8A to 8D. Paper of this embodiment mode is formed as multilayer paper, and the semiconductor device 1 is embedded between a paper layer and a paper layer.

First, a paper material of pulp dissolved in water is prepared. The paper material is evenly stirred and then drained to form a wet paper web 51 (see FIG. 8A).

To improve interlayer strength, starch such as phosphate-esterified starch; cationic polyacrylamide; or the like is sprayed over one surface of the wet paper web 51. Subsequently, the semiconductor device 1 is placed on the surface that is sprayed with starch or the like as an interlayer reinforcer (see FIG. 8B). Note that although in FIGS. 8A to 8D, an example in which one semiconductor device 1 is embedded in one piece of paper is shown, a plurality of the semiconductor devices 1 can be embedded in one piece of paper.

A wet paper web 52 that is prepared separately is placed over the wet paper web 51, and the wet paper webs 51 and 52 are pressed together and attached to each other. It is desirable that the surface of the semiconductor device 1 is hydrophilic so that the semiconductor device 1 fits well between the wet paper webs 51 and 52. Accordingly, it is preferable that a surface of the sealing layer 14 is subjected to a plasma treatment, a corona treatment, or the like so that the surface is modified to have a hydrophilic property or to improve a hydrophilic property. The treatment of the surface of the sealing layer 14 may be performed before or after cutting the stacked-layer body 22.

By drying the wet paper webs 51 and 52 after they are pressed together, paper 2 in which the semiconductor device 1 is embedded between a paper layer 53 and a paper layer 54 is formed. Note that since the conductive layers of the antenna 11 and the circuit portion 12 in the semiconductor device 1 are each formed of a material having high reflectivity, when a color of the paper 2 is white or when the paper 2 is thin, there is concern that the embedded semiconductor device 1 stands out. In order to make the semiconductor device 1 not stand out, a surface of the antenna 11 or a surface of a conductive layer is made to be uneven. By the unevenness on the surface of the antenna 11 or the surface of the conductive layer, light is irregularly reflected at the surface, and the surface looks like it is white and turbid; consequently, an effect where the semiconductor device 1 does not stand out is expected. For example, when aluminum is heated, a surface thereof becomes uneven.

Note that although in FIGS. 8A to 8D, the paper 2 is multilayered paper with two layers, the paper 2 may be multilayered paper with three or more layers. For a method of embedding the semiconductor device 1 in paper, a method of making multilayered paper is preferably employed. This is because controlling a position where the semiconductor device 1 is to be embedded is easy. For example, in the method according to Patent Document 2 in which the semiconductor device 1 is sunk in a raw material of paper dissolved in water, it is difficult to control the position in a thickness direction, and in order to control the position in the thickness direction, it is necessary to balance specific gravity of the semiconductor device 1 and weighing capacity of the paper, which makes it difficult to embed an RE tag in a variety of types of paper. On the other hand, in multilayered papermaking, there is no problem in terms of controlling the position in the thickness direction.

<Circuit Structure Example 1 of Semiconductor Device 1>

Figure 9:
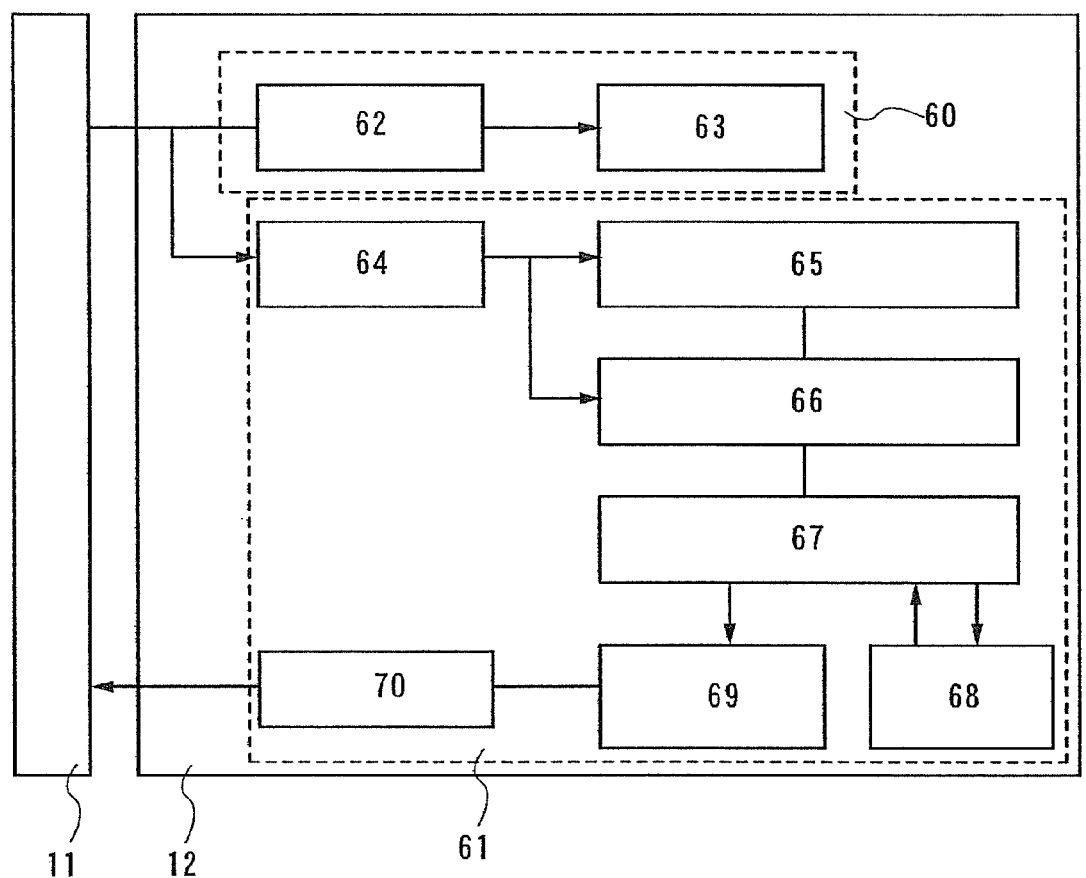
FIG. 9 is a block circuit diagram of a semiconductor device embedded in paper of the present invention.

Next, a circuit structure example of the semiconductor device 1 is described. FIG. 9 shows a block circuit diagram of the semiconductor device 1.

The semiconductor device 1 in FIG. 9 conforms to specifications of ISO 15693 of the International Organization for Standardization, and it is a vicinity type, and has a communication signal frequency of 13.56 MHz. Also, reception only responds to a data reading instruction, data transmission rate in transmission is about 13 kHz, and the Manchester code is used for a data encoding format.

The circuit portion 12 of the semiconductor device 1 is roughly separated into a power supply portion 60 and a signal processing portion 61. The power supply portion 60 includes a rectifying circuit 62 and a storage capacitor 63. The rectifying circuit 62 rectifies a carrier wave received by the antenna 11 and generates a DC voltage. The storage capacitor 63 smoothes the DC voltage generated by the rectifying circuit 62. The DC voltage generated in the power supply portion 60 is supplied to each circuit of the signal processing portion 61 as a power supply voltage.

The signal processing portion 61 includes a demodulation circuit 64, a clock generation/correction circuit 65, a recognition/determination circuit 66, a memory controller 67, a mask ROM 68, an encoding circuit 69, and a modulation circuit 70.

The demodulation circuit 64 is a circuit that demodulates a signal received by the antenna 11. The received signal that is demodulated in the demodulation circuit 64 is input to the clock generation/correction circuit 65 and the recognition/determination circuit 66.

The clock generation/correction circuit 65 generates a clock signal that is necessary for operating the signal processing portion 61, and also has a function of correcting the clock signal. For example, the clock generation/correction circuit 65 includes a voltage controlled oscillator circuit (hereinafter referred to as "VCO circuit"), and turns an output from the VCO circuit into a feedback signal, makes a phase comparison with a supplied signal, and adjusts an output signal by negative feedback so that the feedback signal and a signal that is input are each in a certain phase.

The recognition/determination circuit 66 recognizes and determines an instruction code. The instruction code that is recognized and determined by the recognition/determination circuit 66 is an end-of-frame (EOF) signal, start-of-frame (SOF) signal, a flag, a command code, a mask length, a mask value, or the like. Also, the recognition/determination circuit 66 has a cyclic redundancy check (CRC) function that identifies a transmission error.

The memory controller 67 reads data from the mask ROM 68 based on a signal processed by the recognition/determination circuit 66. Also, an ID or the like is stored in the mask ROM 68. By mounting the mask ROM 68, the semiconductor device 1 is formed to be dedicated to reading, so that replication or falsification is impossible. Paper with an effect of preventing forgery can be provided by embedding the semiconductor device 1 dedicated to reading in paper.

The encoding circuit 69 encodes data that is read from the mask ROM 68 by the memory controller 67. The encoded data is modulated in the modulation circuit 70. The data modulated in the modulation circuit 70 is transmitted from the antenna 11 as a carrier wave.

<Circuit Structure Example 2 of Semiconductor Device 1>

Figure 10:
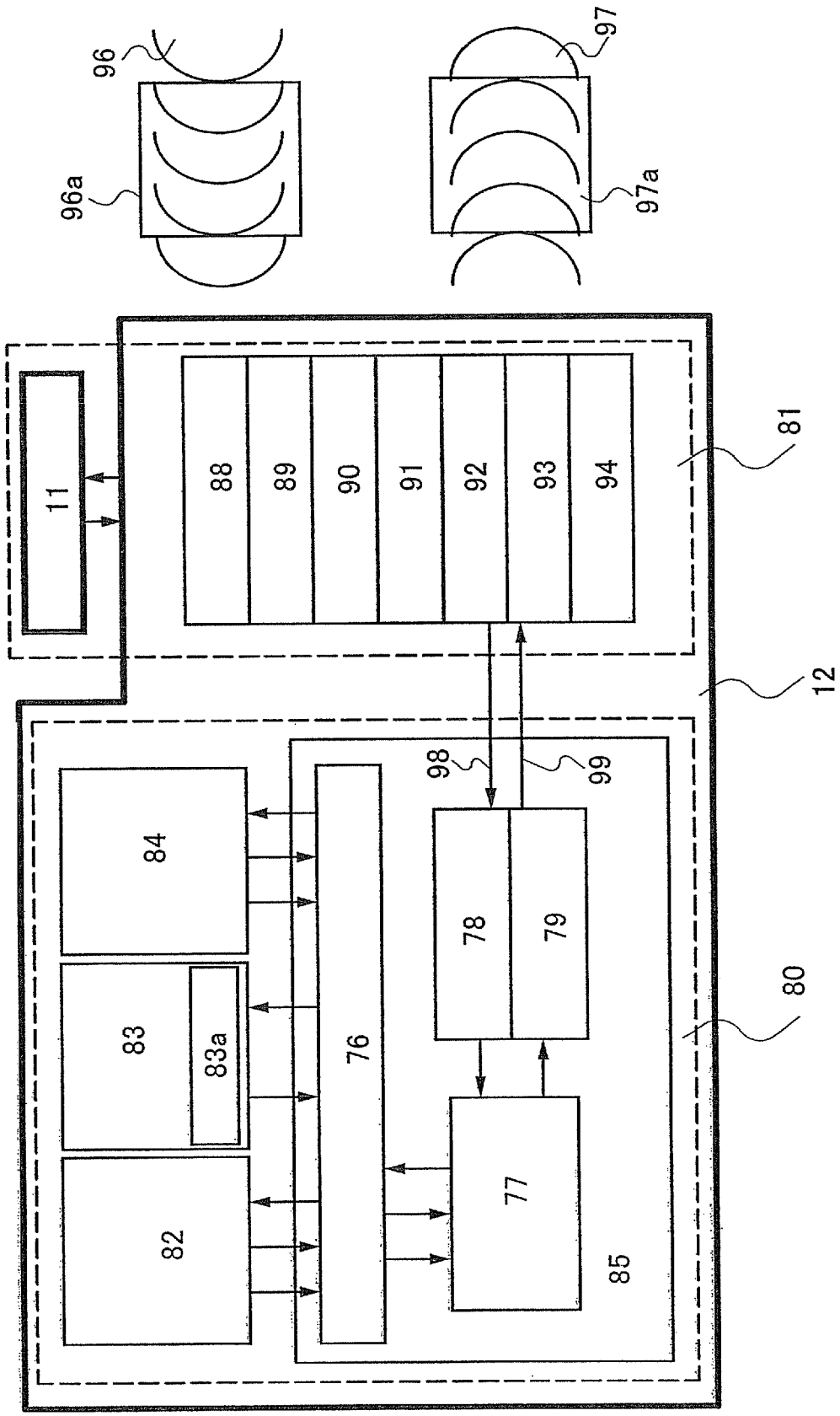
FIG. 10 is a block circuit diagram of the semiconductor device provided with a cryptographic function.

A different circuit structure example of the semiconductor device 1 is described. Here, a circuit structure example of the semiconductor device 1 that is provided with a cryptographic function is described. FIG. 10 is a block circuit diagram of the semiconductor device 1.

The semiconductor device 1 includes the antenna 11 and the circuit portion 12. This circuit portion 12 is largely separated into an arithmetic circuit 80 and an analog portion 81. The arithmetic circuit 80 includes a CPU 82, a ROM 83, a RAM 84, and a controller 85. Also the controller 85 includes a CPU interface (hereinafter referred to as CPUIF) 76, a control register 77, a code extraction circuit 78, and an encoding circuit 79.

The analog portion 81 includes the antenna 11, a resonance circuit 88, a power supply circuit 89, a reset circuit 90, a clock generation circuit 91, a demodulation circuit 92, a modulation circuit 93, and a power supply management circuit 94.

After a reception signal 96 is received by the antenna 11, the reception signal 96 is demodulated by the demodulation circuit 92. Also, after a transmission signal 97 is modulated by the modulation circuit 93, the transmission signal 97 is transmitted by the antenna 11.

When the semiconductor device 1 is placed in a magnetic field formed by a communication signal, induced electromotive force is generated by the antenna 11 and the resonance circuit 88. The induced electromotive force is stored by a capacitor of the power supply circuit 89 and the capacitor also stabilizes a potential of the induced electromotive force. Then, the induced electromotive force is supplied to each circuit of the circuit portion 12 as a power supply voltage.

The reset circuit 90 generates an initial reset signal of the whole semiconductor device 1. For example, the reset circuit 90 generates a signal that rises after an increase in the power supply voltage as a reset signal.

The clock generation circuit 91 changes frequency and a duty ratio of a clock signal depending on a control signal generated by the power supply management circuit 94. The demodulation circuit 92 detects a reception data 98 representing "0" or "1" from a fluctuation in amplitude of the reception signal 96 of an ASK method. The demodulation circuit 92 can be composed of a low-pass filter, for example.

The modulation circuit 93 is a circuit that modulates a transmission data 99. The modulation circuit 93 turns the transmission data 99 into a transmission signal of an ASK method by making an amplitude of the transmission data 99 fluctuate. For example, when the transmission data 99 is "0," the amplitude is changed by changing a resonance point of the resonance circuit 88.

The power supply management circuit 94 monitors power supply voltage supplied to the arithmetic circuit 80 from the power supply circuit 89 or current consumption in the arithmetic circuit 80, and generates in the clock generation circuit 91 a control signal for changing the frequency and duty ratio of the clock signal.

Next, a structure of the arithmetic circuit 80 is described by describing an operation of the semiconductor device 1.

The reception signal 96 that contains ciphertext data 96*a* is transmitted from a reader/writer. After the reception signal 96 received by the antenna 11 is demodulated in the demodulation circuit 92, the reception signal 96 is broken up into a control command, data of a ciphertext, and the like in the code extraction circuit 78, and then stored in the control register 77. The control command is data that specifies a response of the semiconductor device 1, for example, specifies transmission of a unique ID number, stoppage of operation, decryption, or the like. Here, the control command is to be a decryption command.

Then, in the arithmetic circuit 80, the CPU 82 decrypts (decodes) a ciphertext using a secret key 83*a* stored in the ROM 83 in advance, according to a cipher decryption program stored in the ROM 83. The ciphertext that is decoded (decoded text) is stored in the control register 77. At this time, the RAM 84 is used for a data storage region. The CPU 82 accesses the ROM 83, the RAM 84, and the control register 77 via the CPUIF 76. The CPUIF 76 has a function of generating an access signal to any of the ROM 83, the RAM 84, and the control register 77, depending on an address requested by the CPU 82.

Lastly, the transmission data 99 is generated from the decoded text in the encoding circuit 79, the transmission data 99 is modulated in the modulation circuit 93, and the transmission signal 97 containing decoded text data 97*a* is transmitted from the antenna 11 to the reader/writer.

Although a method of processing by software is described as an arithmetic method of the arithmetic circuit 80, the most appropriate arithmetic method can be selected depending on a purpose, and the arithmetic circuit 80 may be formed based on the method. For example, as the arithmetic method, an arithmetic processing method by hardware and an arithmetic processing method by both hardware and software can be considered as alternatives.

The method of processing by software is a method in which the arithmetic circuit 80 is composed of a CPU and a large-scale memory as shown in FIG. 10, and the program is executed by the CPU. In the method of processing by hardware, the arithmetic circuit 80 may be composed of a dedicated circuit. In the method of processing by both hardware and software, the arithmetic circuit 80 may be composed of a dedicated circuit, a CPU, and a memory, and a part of the arithmetic process may be performed in the dedicated circuit and the rest of the arithmetic process may be performed by executing a program in the CPU.

An effect of preventing data leakage to a third party can be improved for the semiconductor device 1 in FIG. 10 by encrypting transmission and reception data. Also, by including the CPU, the semiconductor device 1 can become multi-functional by changing a program executed in the CPU, for example.

<Usage Example of Paper Embedded with Semiconductor Device>

Paper of the present invention embedded with a semiconductor device can be used for a variety of paper media. In particular, the paper of the present invention can be used for a variety of paper media for which forgery prevention is necessary, by making use of a characteristic in which if there is an attempt to take out an RF tag from the paper, evidence thereof is left on the paper. The paper media are, for example, banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, deeds of mortgage, and the like.

In addition, by implementing the present invention, good quality paper, paper for inkjet printing, and the like can function as paper for forgery prevention. For example, the paper of the present invention can be applied to a variety of documents in which confidential information is written, such as contracts and specification documents.

Also, by implementing the present invention, a lot of information, more information than that which is visually shown on a paper medium, can be held in the paper medium. Accordingly, by applying the paper of the present invention to a product label or the like, electronic systemization of product management or prevention of product theft can be realized. Usage examples of paper according to the present invention are describe below with reference to FIGS. 11A to 11E.

Figure 11A:
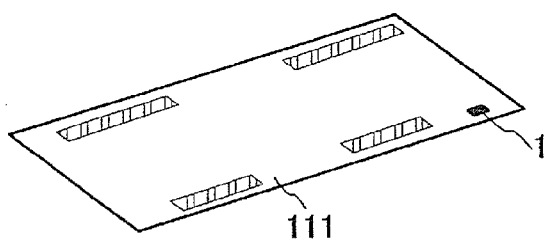
FIGS. 11A to 11E are each a diagram showing usage examples of paper of the present invention.
Figure 11B:
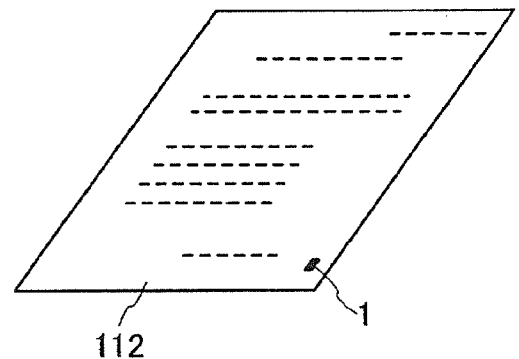

FIG. 11A is an example of a bearer bond 111 using paper of the present invention embedded with the semiconductor device 1. The bearer bond 111 includes a stamp, a ticket such as an admission ticket, a gift certificate, a book coupon, a stationery coupon, a beer coupon, a rice coupon, a variety of gift coupons, a variety of service coupons, and the like, but of course the bearer bond 111 is not limited thereto. Also, FIG. 11B is an example of a certificate 112 using the paper of the present invention embedded with the semiconductor device 1 (for example, a residence certificate or a family register).

Figure 11C:
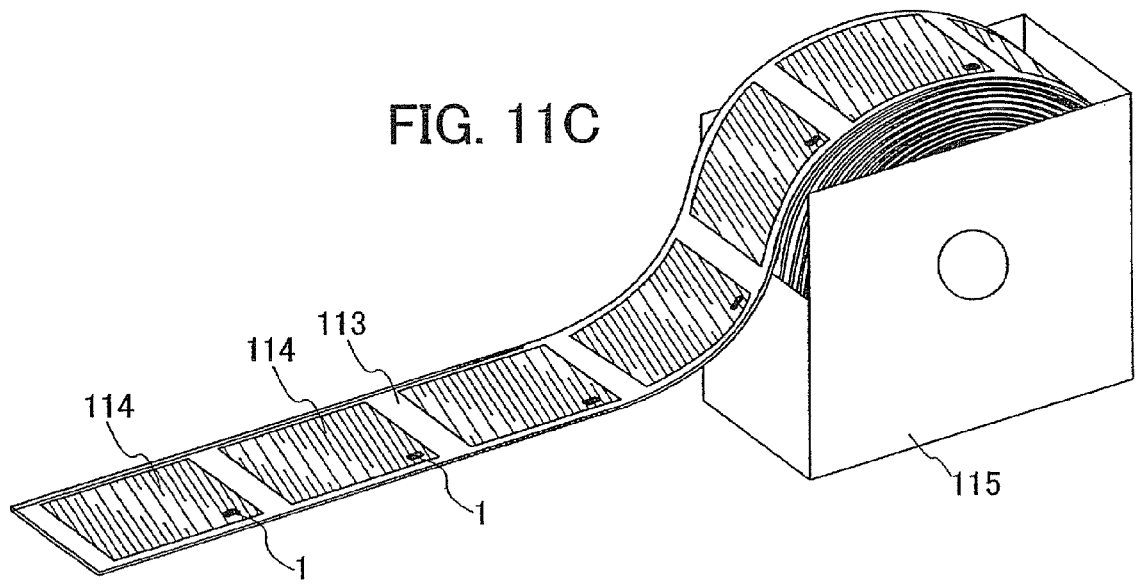

FIG. 11C is an example of applying the paper of the present invention as a label. A label (ID sticker) 114 is formed of the paper embedded with the semiconductor device 1, over a label base (separate paper) 113. The label 114 is stored in a box 115. On the label 114, information regarding a product or a service (such as product name, brand, trademark, trademark owner, seller, or manufacturer) is printed. Also, since a unique ID number of the product (or a category of the product) is stored in the semiconductor device 1, counterfeiting, infringement of intellectual property rights such as a trademark right or a patent right, and illegal activity such as unfair competition can be spotted easily. The semiconductor device 1 can be input with a large amount of information that cannot all be written on a container or a label of the product, such as the product's area of production, area of sales, quality, raw material, effect, usage, quantity, shape, price, production method, usage method, time of production, time of use, expiration date, instruction manual, and intellectual property information relating to the product, for example. Accordingly, a transactor or a consumer can access such information with a simple reader. Further, the information can easily be rewritten, erased, or the like on a producer side, but cannot be rewritten, erased or the like on a transactor or consumer side.

Figure 11D:
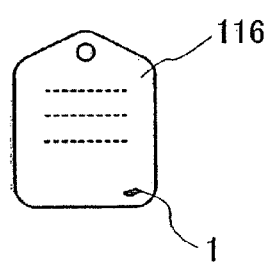
Figure 11E:
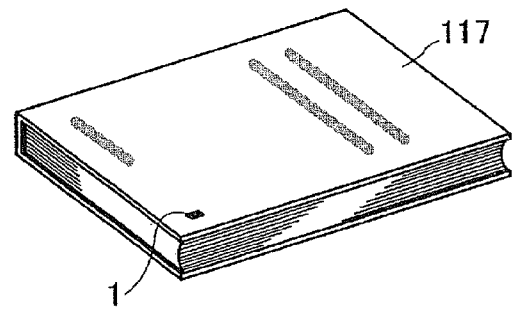

FIG. 11D shows a tag 116 formed of the paper embedded with the semiconductor device 1. By manufacturing a tag with the paper embedded with the semiconductor device 1, the tag can be manufactured less expensively than a conventional ID tag using a plastic chassis. Also, if a product uses paper, the product and the ID tag can be formed integrally by using the paper of the present invention. Such an example is shown in FIG. 11E. FIG. 11E shows a book 117 using the paper of the present invention for a cover, and the semiconductor device 1 is embedded in the cover.

By attaching the label 114 or the tag 116 using the paper of the present invention to the product, or by manufacturing a product with the paper of the present invention, product management becomes easy. For example, when the product is stolen, the perpetrator can be spotted quickly by following a route of the product. In this manner, by using the paper of the present invention for an ID tag, historical management of the product's raw material, area of production, manufacturing and processing, distribution, sales, and the like, as well as tracking inquiry becomes possible. That is, the product becomes traceable. Also, by the present invention, a tracing management system of the product can be introduced at lower cost than before.

Embodiment 1

Figure 12A:
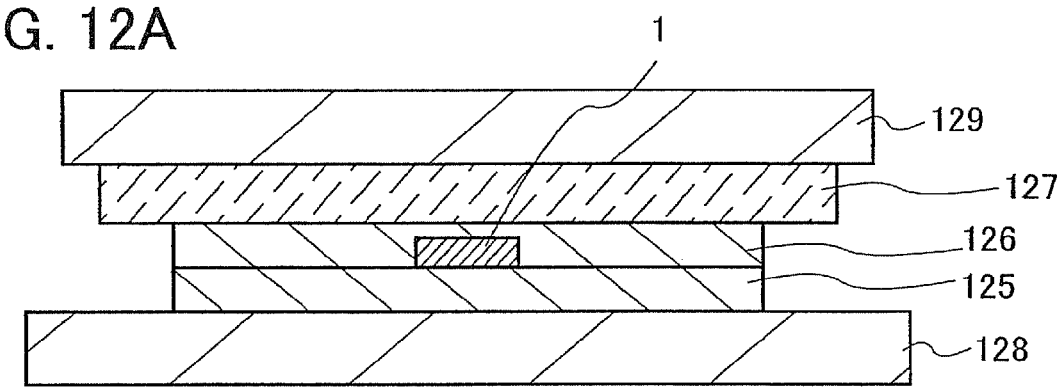
FIGS. 12A and 12B are each a cross-sectional diagram describing a manufacturing method of multilayered paper of Embodiment 1.
Figure 12B:
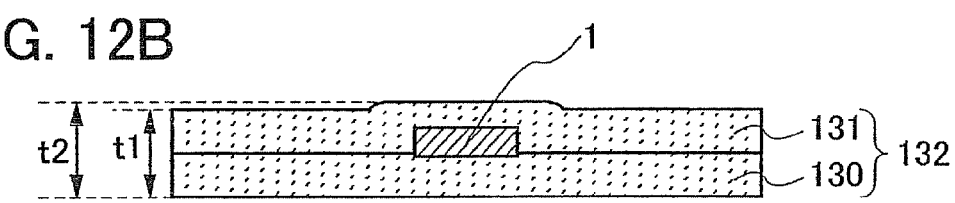

In this embodiment, paper in which a semiconductor device is embedded between two layers of paper was manufactured. In this embodiment, three types of papers, of which thicknesses of the semiconductor device and papers were different from each other, were made. The three types of papers will be referred to as paper A, paper B, and paper C. A manufacturing method of multilayered paper of this embodiment is described with reference to FIGS. 12A and 12B.

<Manufacturing of Paper A>

Wet paper webs 125 and 126 were prepared so that paper layers of both a lower layer and an upper layer each had a basis weight of 28 g/m². After dispersing acetate-esterified starch over a top surface of the wet paper web 125 which was the lower layer, the semiconductor device 1 with a thickness of 50 μm was placed on the top surface of the lower layer wet paper web 125, and the wet paper web 126 which was the upper layer was laminated over the lower layer wet paper web 125. The laminated wet paper webs 125 and 126 were placed on a stage (made of steel) 128 of a pressing machine. With a filter paper 127 placed over a top surface of the wet paper web 126, the wet paper web 125 and the wet paper web 126 were interposed between the stage 128 and a pressing plate (made of steel) 129 of the pressing machine, and then pressed (see FIG. 12A). Pressing time was two minutes and pressure was 20.6 kPa. The pressed wet paper webs 125 and 126 were dried in a drying machine for 100 seconds at a temperature of 100° C., and multilayered paper 132 made of a paper layer 130 and a paper layer 131 was manufactured (see FIG. 12B).

The thickness t1 of a portion of the paper A that did not include the semiconductor device 1 was 100 μm, and the thickness t2 of a portion that included the semiconductor device 1 was 125 μm. The difference between the thicknesses t2 and t1 was 25 μm. In the paper A, a surface of the paper layer 130 on which the filter paper 127 was not placed was formed to be a flat surface without unevenness. A surface of the paper layer 131 was formed to be a surface with a high degree of smoothness, and unevenness in a portion over the semiconductor device 1 was only felt slightly by one's fingertips.

<Manufacturing of Paper B>

The basis weight of paper was 30 g/m² and the thickness of the semiconductor device 1 was 26 μm. Other conditions for making the paper 132 were similar to those of the paper A. In a similar manner to the paper A, the surface of the paper layer 130 on which the filter paper 127 was not placed did not show unevenness and was flat, and the surface of the paper layer 131 was formed to be a surface with a high degree of smoothness on which unevenness due to the semiconductor 1 was only felt slightly by one's fingertips.

The paper B was made thicker than the paper A since the basis weight was more than that of the paper A. In the paper B, the thickness t1 of the portion that did not include the semiconductor device 1 was 110 μm, the thickness t2 of the portion that included the semiconductor device 1 was 129 μm, and the difference between the thicknesses t2 and t1 was 19 μm. Since the thickness of the semiconductor device 1 in the paper B was thinner than that in the paper A and the thickness of the paper B was thicker, the difference between the thicknesses t2 and t1 was able to be made smaller than that of the paper A.

<Manufacturing of Paper C>

The paper C is a comparative example, and except for the thickness of the semiconductor device 1 being 135 μm, the paper was formed under the same conditions as those of the paper A. In the paper C, the thickness t1 of the portion that did not include the semiconductor device 1 was 100 μm, the thickness t2 of the portion that included the semiconductor device 1 was 210 μm, and the difference between the thicknesses t2 and t1 was 110 μm. In the case of the paper C, since the semiconductor device 1 that was thicker than the paper layers 130 and 131 (about 50 μm each) was embedded, there was a bulge with about the same thickness as that of the semiconductor device 1 that was caused; however, there was no unevenness due to the semiconductor device 1 on the surface of the paper layer 130 on which the filter paper 127 was not placed.

As a result of making the papers A to C, the following findings (1) to (3) were obtained.

(1) In a pressing step, by directly pressing one surface of two layers of wet paper webs that are attached to each other, with a rigid body that does not change in shape such as steel, and pressing the other surface with a similar rigid body with a soft object that can change in shape (a filter paper in this embodiment) interposed therebetween, unevenness due to an RF tag can be prevented from occurring on the surface that is directly pressed with the rigid body. Note that it is acceptable as long as the soft object that can change in shape can change its shape according to unevenness on a surface of the wet paper webs caused by the RF tag when the wet paper webs are pressed.

When the present invention is implemented, one surface of the paper webs may be made to be in contact with an object that does not change in shape (the rigid body) in a pressing step, the other surface may be made to be in contact with the object that can change in shape, and the wet paper webs may be pressed with a pair of flat plates of a pair of rollers. The object that can change in shape may be fixed to one of the flat plates or rollers, or not.

(2) In the case of multilayered paper with two layers, as with the paper A and the paper B, by embedding an RF tag having about the same thickness as about ½ of the thickness t1 of the paper that is made or thinner, that is, about the thickness of one layer of a paper layer, unevenness that occurs on the other surface (the surface pressed with the soft object interposed therebetween) can be minimal. If this slight unevenness on the surface is a problem, at least one layer of a paper layer can be laminated over this surface to lose the unevenness.

(3) By this embodiment, it is found that an RF tag can be embedded in multilayered paper that is thin, as in 130 μm thick or less, without losing smoothness of a surface. As with the paper B, the paper thickness can be made to be as thin as 110 μm, or thinner. Also, it is found that multilayered paper that is thin, as in 100 μm or thinner like the paper A, can be manufactured.

Embodiment 2

Figure 13:
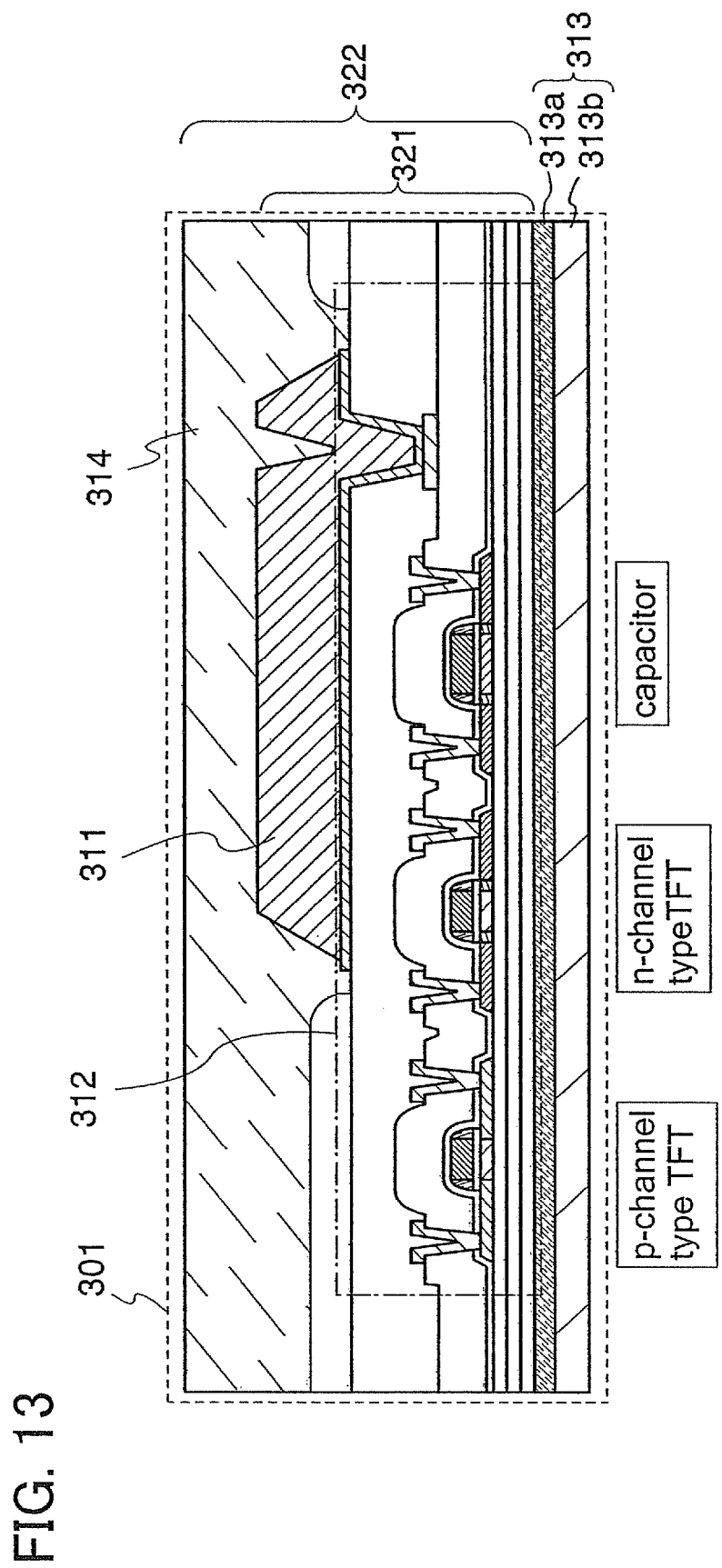
FIG. 13 is a diagram showing an example of a cross-sectional structure of a semiconductor device embedded in paper of the present invention (Embodiment 2)

In this embodiment, a manufacturing method of a semiconductor device 301 with a thickness of 30 μm or less is described. FIG. 13 is a schematic cross-sectional diagram of the semiconductor device 301 of this embodiment. Note that a top surface structure of the semiconductor device 301 of this embodiment is similar to that of the semiconductor device 1 in FIG. 1C, and the semiconductor device 301 is composed of an antenna 311 and a circuit portion 312. Note that in FIG. 13, as one example of a cross-sectional structure, only a p-channel type TFT, an n-channel type TFT, a capacitor, and a connection portion to the antenna 311 are shown as the circuit portion 312.

In an element layer 321, the circuit portion 312 in which circuits each including an electronic element such as a TFT are integrated, and the antenna 311 are stacked. A side surface of the element layer 321 is made of stacked layer films of insulating films that are formed when manufacturing the element layer 321, which is described later. Also, a flexible base 313 is attached to a bottom portion of the element layer 321. The flexible base 313 has a stacked-layer structure of an adhesion layer 313a and a base film 313b, and the base film 313b is attached to the element layer 321 with the adhesion layer 313a. A top surface of the element layer 321 is sealed with a sealing layer 314. Over the flexible base 313, a stacked-layer body 322 including the element layer 321 and the sealing layer 314 is provided.

A manufacturing method of the semiconductor device 301 is hereinafter described with reference to cross-sectional diagrams FIGS. 13 to 20B.

To form the stacked-layer body 322, a glass substrate 400 is prepared. First, a peeling layer is formed over the glass substrate 400. A silicon oxynitride film 401 with a thickness of 100 nm is formed over the glass substrate 400 using $SiH_4$ and $N_2O$ for source gases, using a plasma CVD apparatus. Then, a tungsten film 402 with a thickness of 30 nm is formed using a sputtering apparatus. Thereafter, a silicon oxide film 403 with a thickness of 200 nm is formed using a sputtering apparatus (see FIG. 14A).

By forming the silicon oxide film 403, a surface of the tungsten film 402 is oxidized and tungsten oxide that has a weak molecular bond with tungsten is formed on the surface of the tungsten film 402. Using such a portion with a weak bond, the stacked-layer body 322 is separated from the glass substrate 400. Since the tungsten film 402 has poor adhesion to the glass substrate 400, the silicon oxynitride film 401 is formed to maintain adhesion of the tungsten film 402 while manufacturing the stacked-layer body 322. Note that the silicon oxide film 403 can also be formed using a CVD apparatus.

Figure 14A:
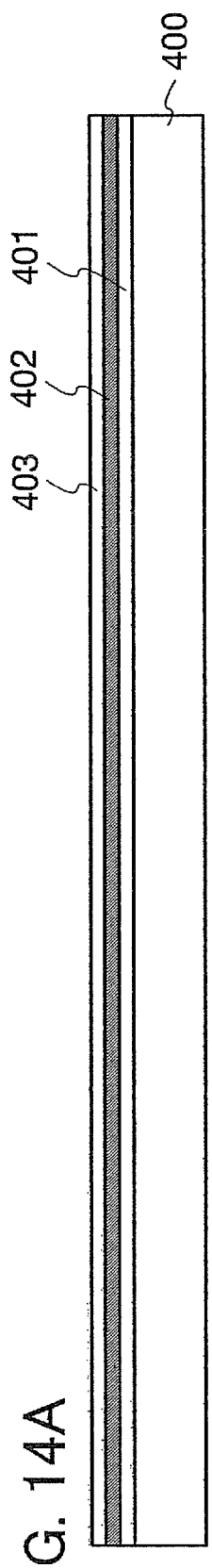
FIGS. 14A to 14D are cross-sectional diagrams for describing a manufacturing process of the semiconductor device (Embodiment 2)
Figure 14B:
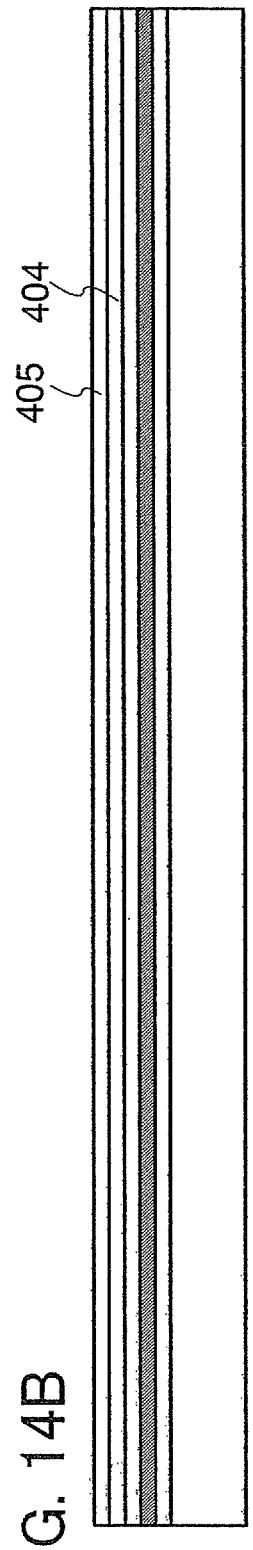
Figure 14C:
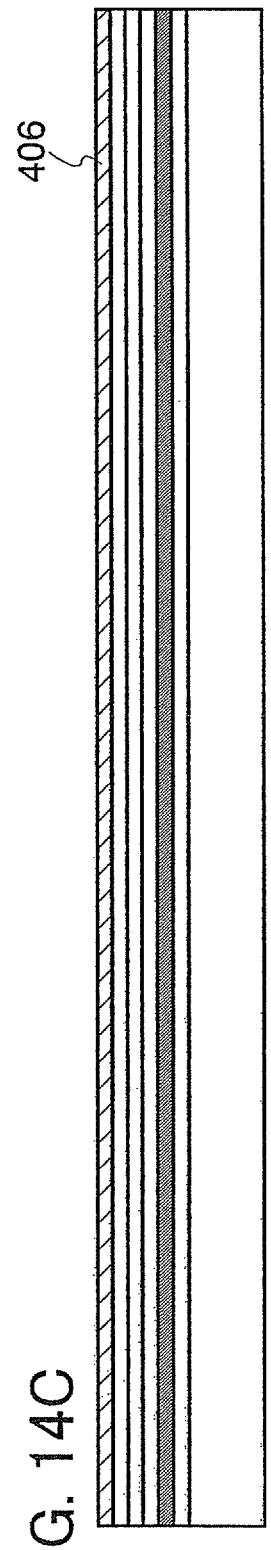

As shown in FIG. 14B, two layers of insulating films are formed over the silicon oxide film 403. For a first layer, a silicon oxynitride film 404 is formed with a thickness of 50 nm using $SiH_4$, $N_2O$, $NH_3$, and $H_2$ for source gases, using a plasma CVD apparatus. A barrier property of the silicon oxynitride film 404 is improved so that a composition ratio of nitrogen becomes 40% or more. For a second layer, a silicon oxynitride film 405 is formed with a thickness of 100 nm using $SiH_4$ and $N_2O$ for source gases, using a plasma CVD apparatus. Since a semiconductor layer of a TFT or the like made of crystalline silicon is made to be closely in contact with a surface of the silicon oxynitride film 405, a composition ratio of nitrogen in the silicon oxynitride film 405 is made to be less than or equal to 0.5% so that an interface state with the semiconductor layer does not occur.

An amorphous silicon film with a thickness of 66 nm is formed on a surface of the silicon oxynitride film 405 using $SiH_4$ and $H_2$ for source gases, using a plasma CVD apparatus. The amorphous silicon film is irradiated with a second harmonic of a $YVO_4$ laser (wavelength of 532 nm) and crystallized to form a crystalline silicon film 406 (see FIG. 14C).

After the crystalline silicon film 406 is formed, boron is added to the entire crystalline silicon film 406 in an ion doping apparatus using diborane ($B_2H_6$) diluted with hydrogen for a doping gas. Since crystalline silicon obtained by crystallizing amorphous silicon has a dangling bond, it is not ideal intrinsic silicon, and shows weak n-type conductivity. Therefore, adding an extremely small amount of a p-type impurity has an effect of making the crystalline silicon film 406 into intrinsic silicon. This process may be carried out as needed.

Figure 14D:
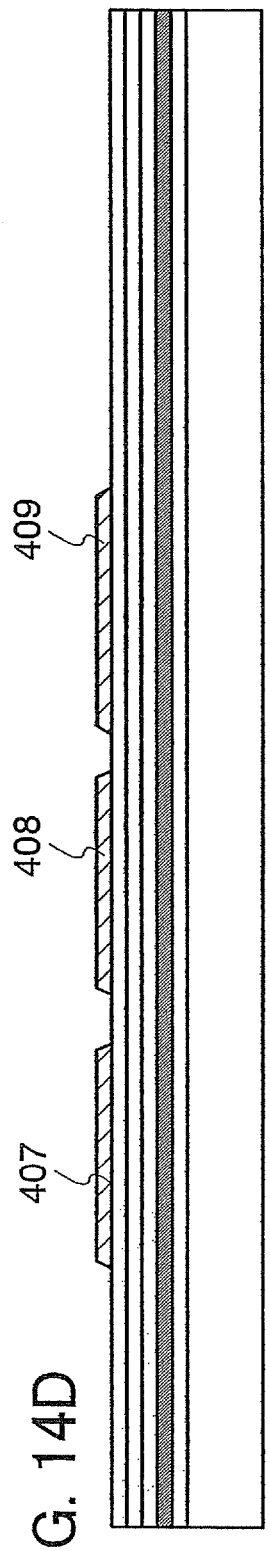

By forming a resist over the crystalline silicon film 406 by a photolithography step and etching the crystalline silicon film 406 with $SF_6$ and $O_2$ gases using the resist as a mask, semiconductor layers 407 to 409 with predetermined shapes are formed, as shown in FIG. 14D. The semiconductor layers 407 and 408 are each a semiconductor layer in which a channel formation region, a source region, and a drain region of the TFT are formed. The semiconductor layer 409 form an electrode of a MIS-type capacitor.

Figure 15A:
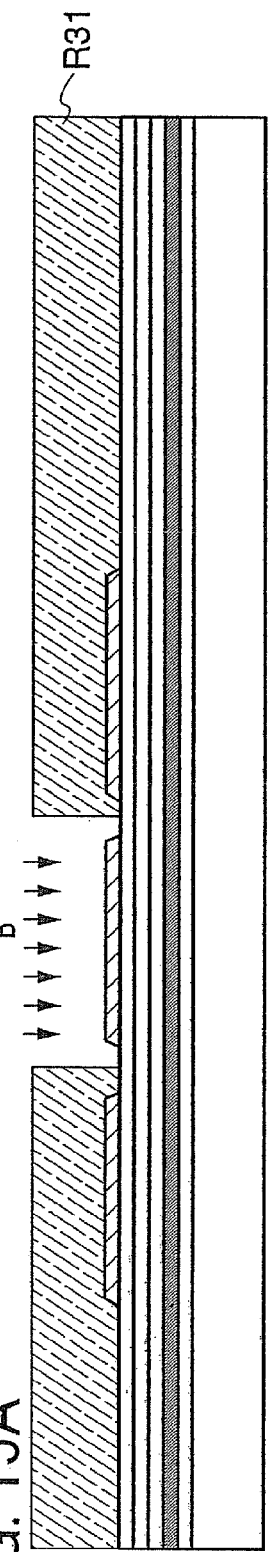
FIGS. 15A to 15D are cross-sectional diagrams for describing the manufacturing process (Embodiment 2)

As shown in FIG. 15A, a resist R31 is formed by a photolithography step so that a threshold voltage of an n-channel TFT does not become a negative voltage. Using the resist R31 for a mask, an extremely small amount of boron is added to the semiconductor layer 408 of the n-channel TFT. The resist R31 is removed after doping is completed.

Figure 15B:
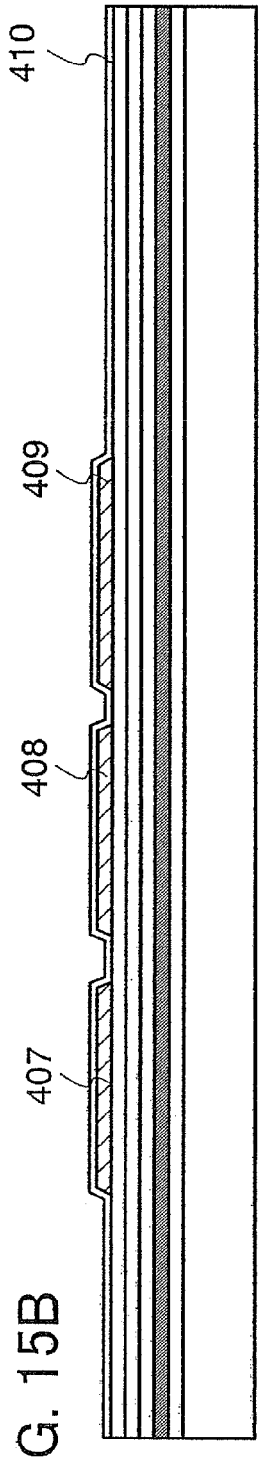
Figure 15C:
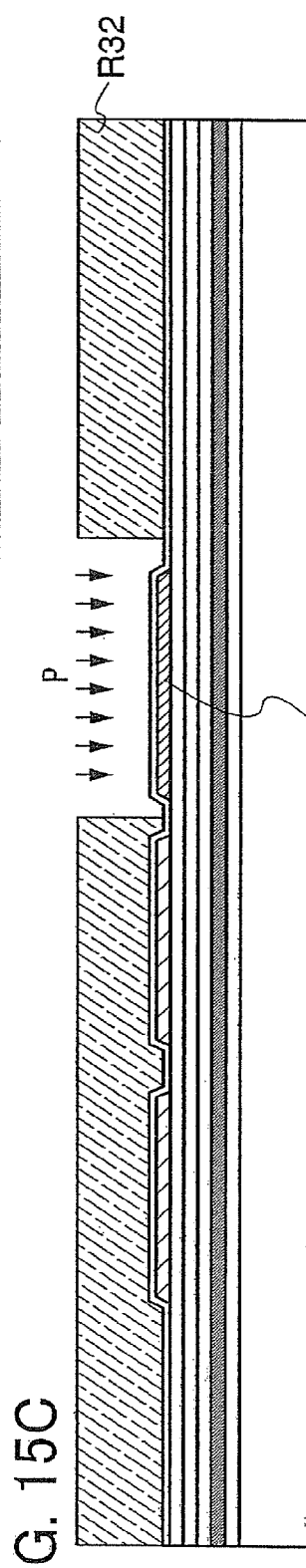

As shown in FIG. 15B, a silicon oxynitride film 410 with a thickness of 20 nm is formed over the entire glass substrate 400 using $SiH_4$ and $N_2O$ as source gases, using a plasma CVD apparatus. The silicon oxynitride film 410 is to be a gate insulating film of a TFT and a dielectric of the capacitor.

A resist R32 is formed by a photolithography step. Using phosphine ($PH_3$) diluted with hydrogen as a doping gas, the semiconductor layer 409 of the capacitor is doped with phosphorus, and an n-type impurity region 412 is formed over the entire semiconductor layer 409, using an ion doping apparatus (see FIG. 15C). When a doping step is completed, the resist R32 is removed.

Figure 15D:
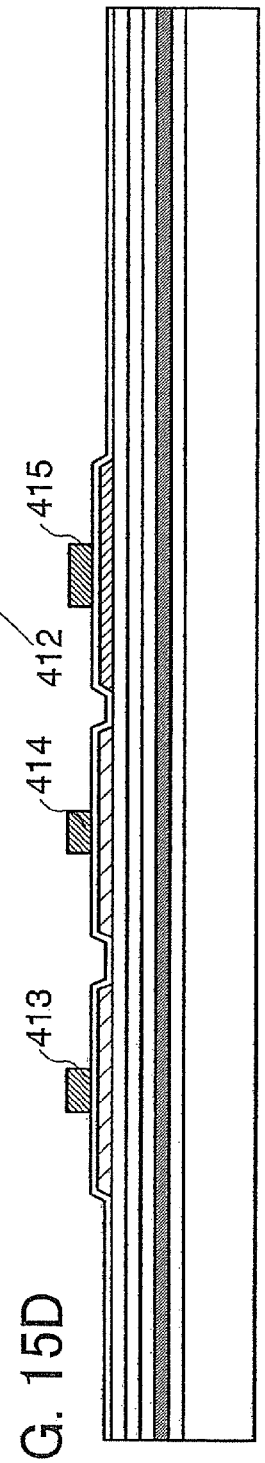

Next, a conductive layer for forming a gate electrode of a TFT is formed over the silicon oxynitride film 410 (see FIG. 15D). Stacked layer films of a tantalum nitride (TaN) film with a thickness of 30 nm and a tungsten (W) film with a thickness of 370 nm are formed. Each of the tantalum nitride film and the tungsten film is formed by a sputtering apparatus. A resist is formed by a photolithography step, and the foregoing stacked layer films are etched using an etching apparatus to form first conductive layers 413 to 415. Each of the first conductive layers 413 and 414 forms a gate electrode or a gate wiring of the TFT, and the first conductive layer 415 forms one electrode of the capacitor.

As the etching apparatus, an inductively-coupled plasma etching apparatus is used. For an etchant, a mixed gas of $Cl_2$, $SF_6$, and $O_2$ is used first for etching the tungsten film, and then the etchant, which is introduced to a treatment chamber, is changed to $Cl_2$ gas only and the tantalum nitride film is etched.

As shown in FIG. 16A, a resist R33 is formed by a photolithography step. The semiconductor layers 408 and 409 are added with phosphorus by an ion doping apparatus using phosphine ($PH_3$) diluted with hydrogen as a doping gas. With the first conductive layer 414 as a mask, n-type low concentration impurity regions 416 and 417 are formed in a self-aligning manner in the semiconductor layer 408. In a similar manner, with the first conductive layer 415 as a mask, n-type low concentration impurity regions 418 and 419 are formed in a self-aligning manner in the semiconductor layer 409. This step is a step for forming an LDD region in the n-channel TFT. It is made so that an n-type impurity in the n-type low concentration impurity regions 416 and 417 is contained in a rage of more than or equal to $1 \times 10^{16}$ atoms/$cm^3$ and less than or equal to $5 \times 10^{18}$ atoms/$cm^3$.

As shown in FIG. 16B, a resist R 34 is formed by a photolithography step. Boron is added to the semiconductor layer 407 of the p-channel using diborane ($B_2H_6$) diluted with hydrogen as a doping gas in a doping apparatus. P-type high concentration impurity regions 407a and 407b are formed in a self-aligning manner in the semiconductor layer 407 with the first conductive layer 413 as a mask. Also, a region covered by the first conductive layer 413 is formed as a channel formation region 407c in a self-aligning manner. The resist R34 is removed after doping is completed.

As shown in FIG. 16C, insulating layers 423 to 425 are formed in vicinities of the first conductive layers 413 to 415, respectively. The insulating layers 423 to 425 are called sidewalls. First, using $SiH_4$ and $N_2O$ for source gases, a silicon oxynitride film is formed with a thickness of 100 nm using a plasma CVD apparatus. Next, using $SiH_4$ and $N_2O$ for source gases, a silicon oxide film is formed with a thickness of 200 nm using an LPCVD apparatus. Then, a resist is formed by a photolithography step. Using this resist, first, the silicon oxide film of an upper layer is subjected to wet etching with buffered hydrofluoric acid. Subsequently, the resist is removed, and by subjecting the silicon oxynitride film of a lower layer to dry etching, the insulating layers 423 to 425 are formed. With this sequence of steps, the silicon oxynitride film 410 is etched, and only portions below the first conductive layers 413 to 415 and the insulating layers 423 to 425 are left.

Figure 17A:
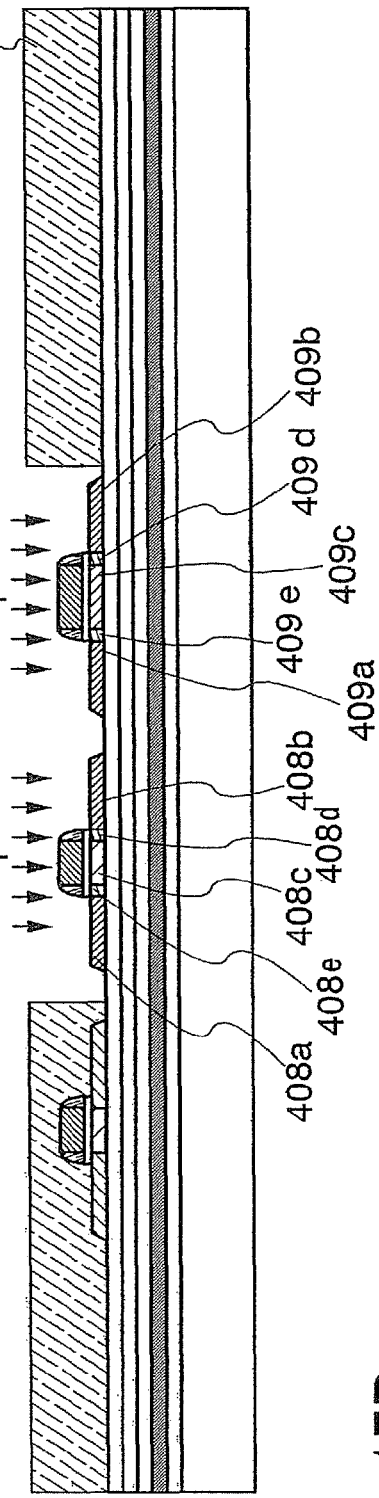
FIGS. 17A to 17C are cross-sectional diagrams for describing the manufacturing process (Embodiment 2)

As shown in FIG. 17A, a resist R35 is formed by a photolithography step. Using an ion doping apparatus, an n-type impurity is added to the semiconductor layer 408 of the n-channel TFT and the semiconductor layer 409 of the capacitor, using phosphine ($PH_3$) diluted with hydrogen for a doping gas to form n-type high concentration impurity regions. In the semiconductor layer 408, with the first conductive layer 414 and the insulating layer 424 as masks, n-type high concentration impurity regions 408a and 408b are formed in a self-aligning manner, and a region overlapped with the first conductive layer 414 is set as a channel formation region 408c in a self-aligning manner. Also, a region in each of the n-type low concentration impurity regions 416 and 417 that is overlapped with the insulating layer 424 is set as n-type low concentration impurity regions 408e and 408d as is.

In a similar manner to the semiconductor layer 408, n-type high concentration impurity regions 409a and 409b, a channel formation region 409c, and n-type low concentration impurity regions 409e and 409d are formed in the semiconductor layer 409.

Figure 17B:
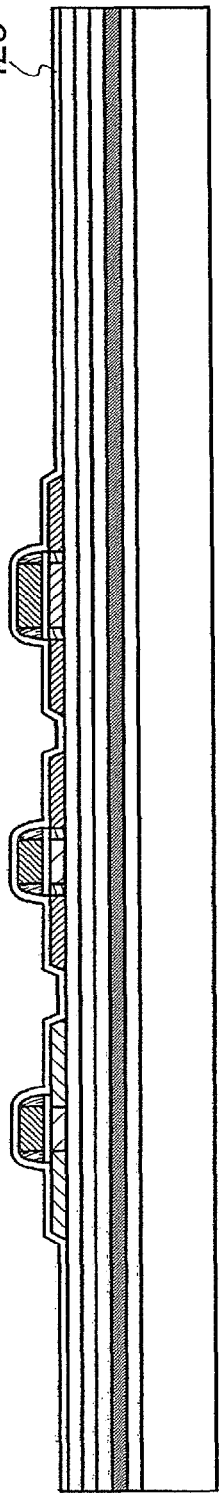

The resist R35 is removed, and a silicon oxynitride film 426 is formed with a thickness of 50 nm using a plasma CVD apparatus, as shown in FIG. 17B. For source gases of the silicon oxynitride film 426, $SiH_4$ and $N_2O$ are used. After forming the silicon oxynitride film 426, a heating treatment is carried out in a nitrogen atmosphere at 550° C. to activate the n-type impurity and p-type impurity added to the semiconductor layers 407 to 409. At this time, a dangling bond in the semiconductor layers 407 to 409 is terminated by hydrogen contained in the silicon oxynitride film 426.

Figure 17C:
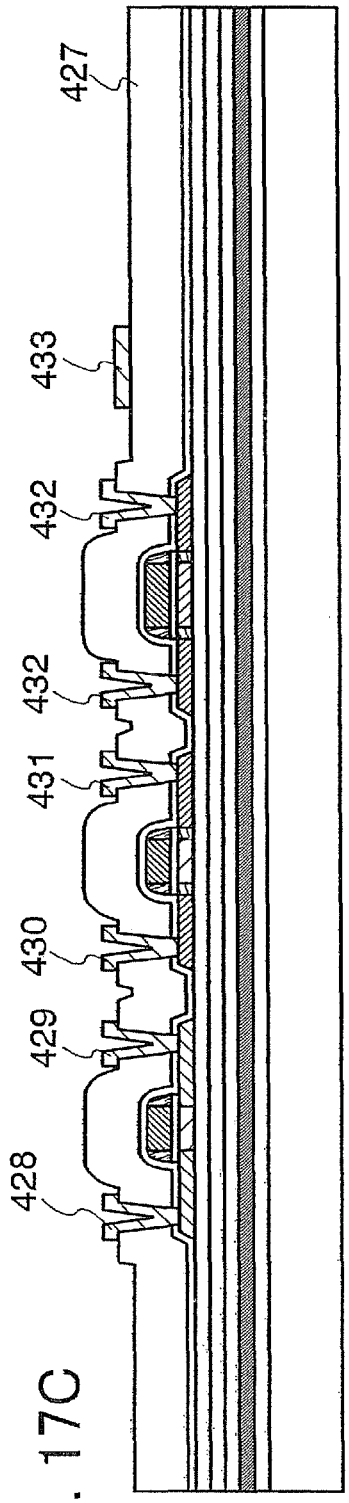

As shown in FIG. 17C, a silicon oxynitride film 427 with a two-layer structure is formed. A lower layer is formed using a plasma CVD apparatus with $SiH_4$ and $N_2O$ for source gases to have a thickness of 100 nm. An upper layer is formed using a plasma CVD apparatus with $SiH_4$, $N_2O$, $NH_3$, and $H_2$ for source gases to have a thickness of 600 nm.

Contact holes are formed in the silicon oxynitride film 427 and the silicon oxynitride film 426 by a photolithography step and a dry etching step. Next, a conductive film having a four-layer structure is formed over the silicon oxynitride film 427. From the bottom, a titanium (Ti) layer, a titanium nitride (TiN) layer, a pure aluminum layer, and a titanium nitride (TiN) layer are stacked in this order with thicknesses of 60 nm, 40 nm, 500 nm, and 100 nm, respectively. Each layer is formed using a sputtering apparatus. The conductive film is processed into a predetermined shape by a photolithography step and a dry etching step to form second conductive layers 428 to 433, as shown in FIG. 17C.

The n-type high concentration impurity regions 409a and 409b are connected by the second conductive layer 432. The MIS type capacitor having a stacked-layer structure including the channel formation region 409c, the silicon oxynitride film 410, and the first conductive layer 414 is formed. The second conductive layer 433 forms a terminal to which the antenna 311 is connected.

Figure 18A:
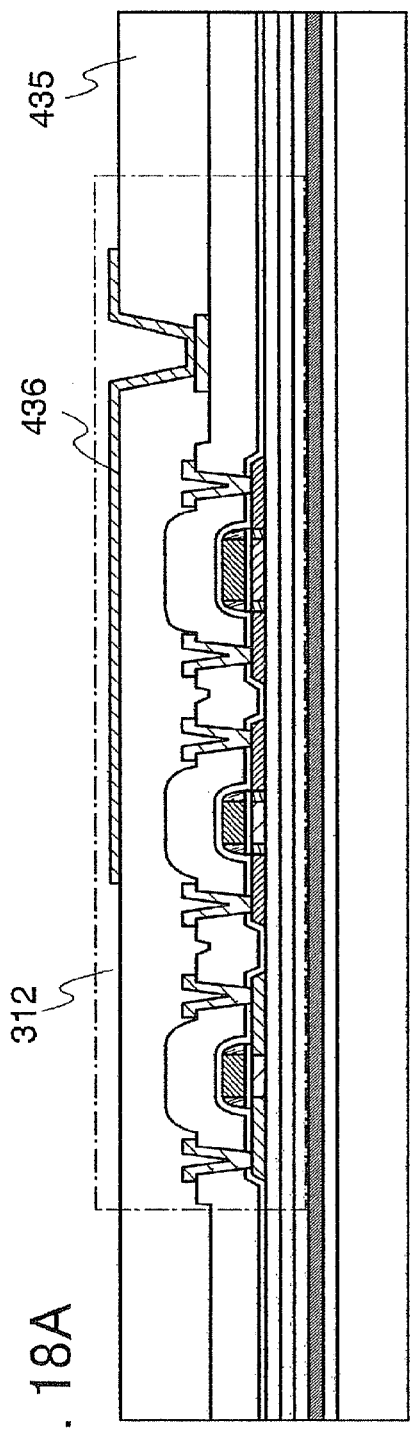
FIGS. 18A and 18B are cross-sectional diagrams for describing the manufacturing process (Embodiment 2)

As shown in FIG. 18A, a polyimide 435 is formed. Here, a photosensitive polyimide is used. The polyimide is applied using a spinner to have a thickness of 1.5 μm. By developing the polyimide by light exposure using a photolithography step, the polyimide 435 in which a contact hole is faulted is formed. After development, the polyimide is baked.

A titanium film with a thickness of 100 nm is formed over the polyimide 435 using a sputtering apparatus. The titanium film is processed into a predetermined shape by a photolithography step and an etching step to form a third conductive layer 436 as shown in FIG. 18A. As a conductive film forming the third conductive layer 436, a Ti film with a thickness of 100 nm is formed using a sputtering apparatus. The third conductive layer 436 is a bump of the antenna 311 for connecting the antenna 311 to the terminal (the second conductive layer 433) of the circuit portion 312. By the above steps, the circuit portion 312 is formed.

Figure 18B:
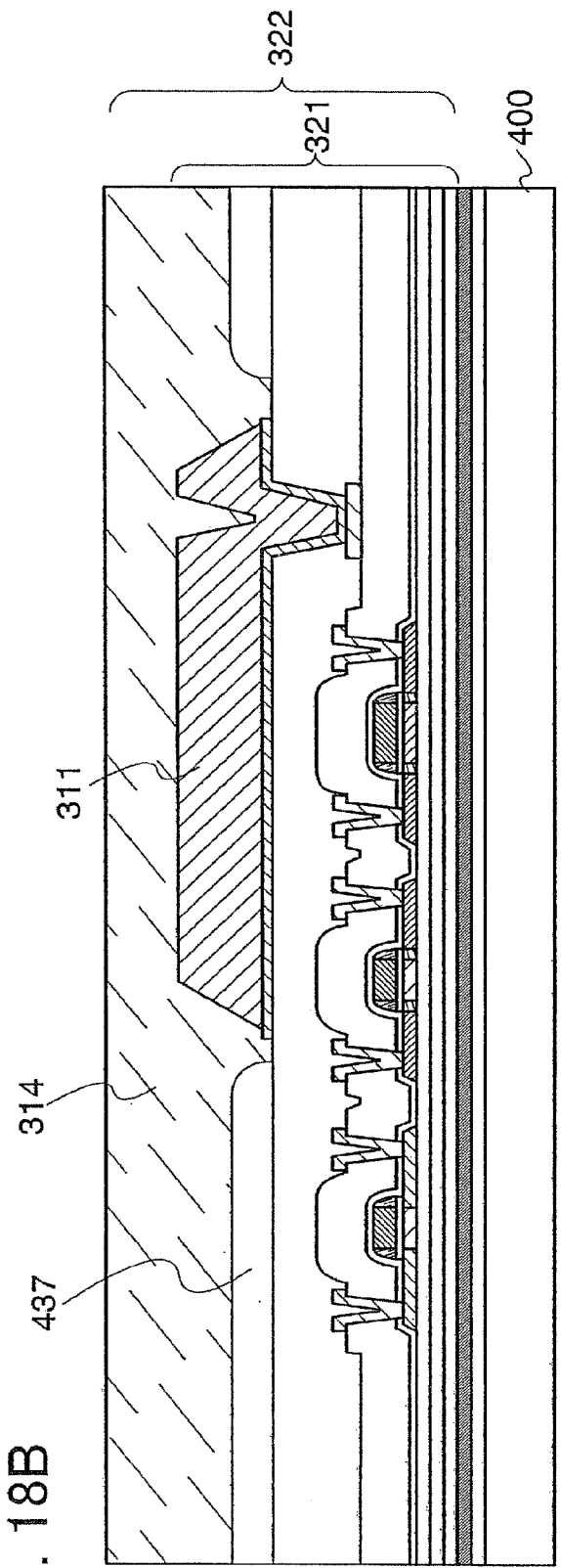

As shown in FIG. 18B, a polyimide 437 is formed. Here, similarly to the polyimide 435, the polyimide 437 in which an opening portion is famed is formed using photosensitive polyimide by a similar method. The opening portion is formed in a region in which the antenna 311 is formed.

As shown in FIG. 18B, the antenna 311 is formed. Using an evaporation apparatus, aluminum is evaporated to have a thickness of 5 μm using a metal mask, and the antenna 311 having a predetermined shape is formed. By the foregoing, the element layer 321 is formed over the glass substrate 400.

Next, the sealing layer 314 for sealing a surface of the element layer 321 is formed. The sealing layer 314 is formed by applying a thermosetting epoxy resin to have a thickness of about 15 μm by a printing method, and then baking the thermosetting epoxy resin. By the foregoing, the stacked-layer body 322 is manufactured. Then, the stacked-layer body 322 is cut to separate each semiconductor device 301 from one another, and the cut stacked-layer body 322 is transferred to the separate flexible base 313.

Figure 19A:
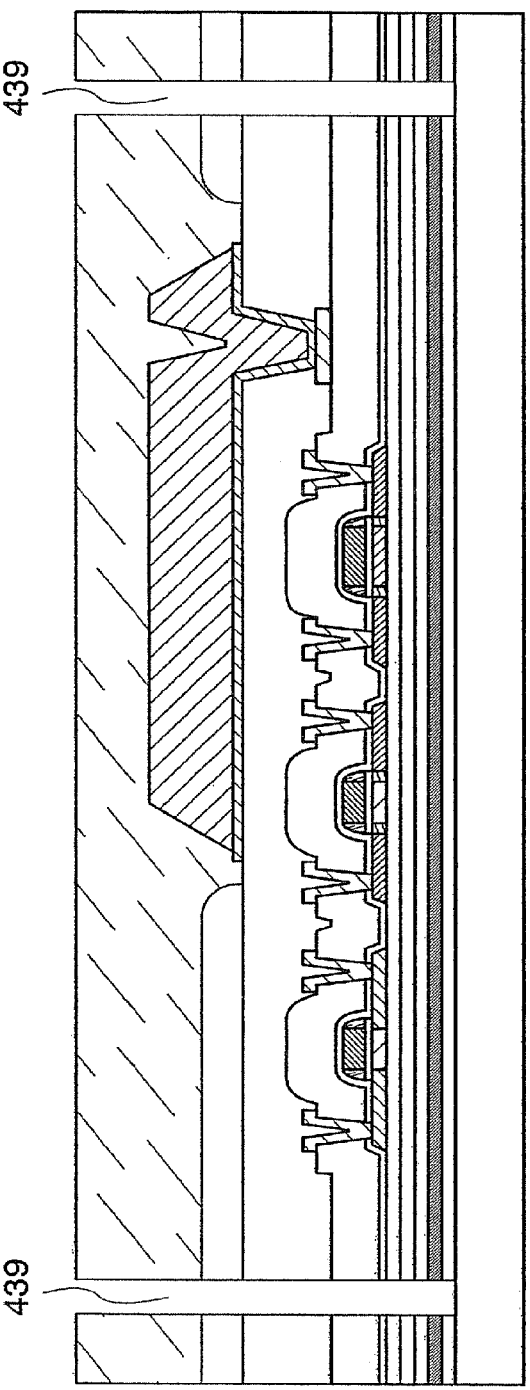
FIGS. 19A and 19B are cross-sectional diagrams for describing the manufacturing process (Embodiment 2)

As shown in FIG. 19A, the insulating films stacked in the element layer 321 are removed along with the sealing layer 314 by laser light irradiation to form an opening portion 439 that reaches the tungsten film 402, and the stacked-layer body 322 is divided to separate each semiconductor device 301 from one another. In this step, a side surface of the stacked-layer body 322 is fondled of the sealing layer 314 and stacked layer films of the insulating films included in the element layer 321, and the side surface can be a surface where the sealing layer 314 and the stacked layer films of the insulating films are aligned with each other. Note that although the opening portion 439 is formed to reach the glass substrate 400, it is acceptable as long as the opening portion 439 reaches at least the tungsten film 402

Figure 19B:
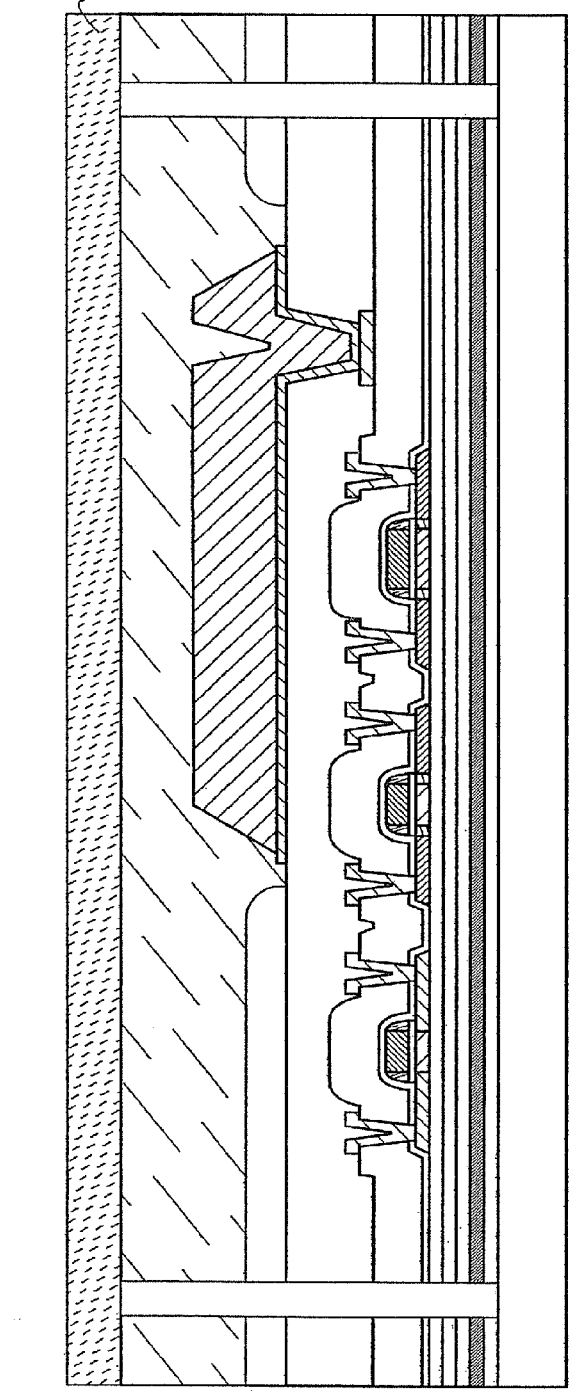

Next, a UV peeling tape 440 of which adhesion becomes weak by UV light irradiation is fixed to the sealing layer 314 as shown in FIG. 19B. Note that the formation of the opening portion 439 becomes a trigger for the stacked-layer body 322 to begin to peel off at an interface between the tungsten film 402 and the tungsten oxide formed thereon, from an end portion of the opening portion 439. This is thought to be because by using a resin (epoxy resin) for the sealing layer 314, the sealing layer 314 contracts slightly when the opening portion 439 is fanned, which applies a force, and the tungsten film 402 with a weak bond peels. Further, force is applied to the UV peeling tape 440 to peel the stacked-layer body 322 off of the glass substrate 400 (see FIG. 20A).

Figure 20A:
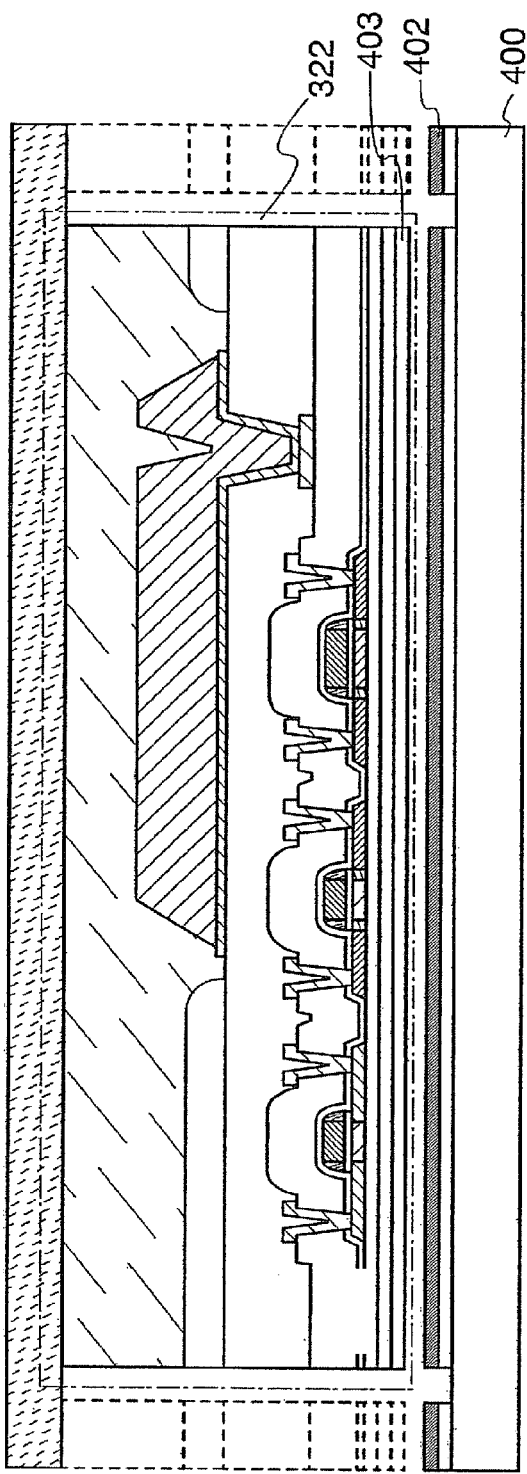
FIGS. 20A and 20B are cross-sectional diagrams for describing the manufacturing process (Embodiment 2).
Figure 20B:
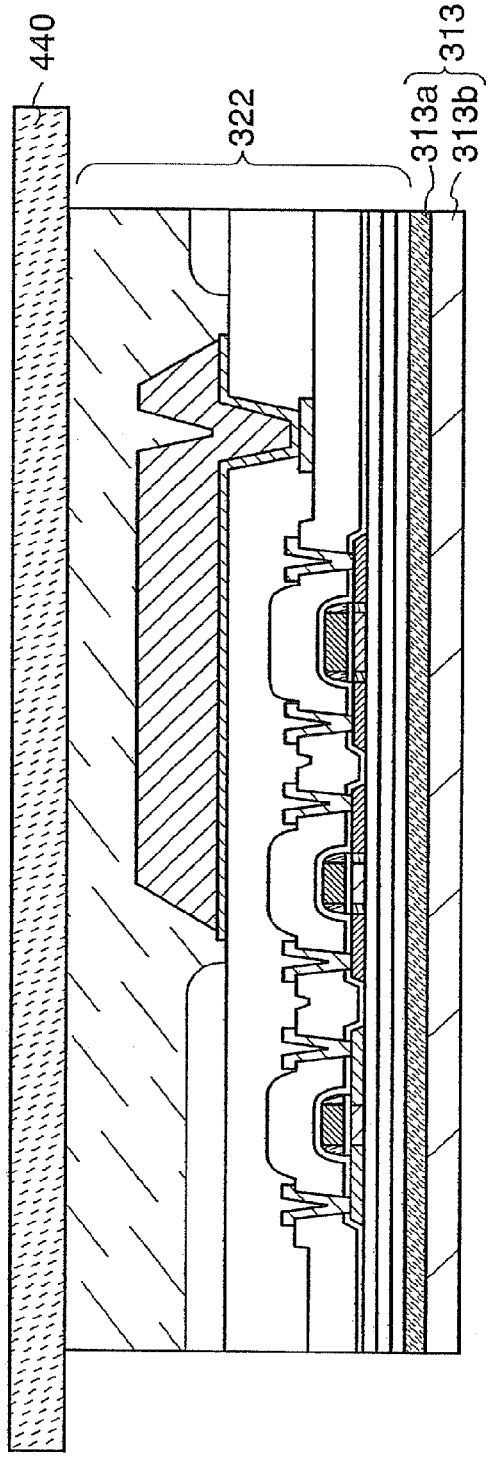

As shown in FIG. 20B, the flexible base 313 is attached to a bottom portion of the stacked-layer body 322 (a bottom surface of the silicon oxide film 403) from which the tungsten film 402 is peeled off. In the flexible base 313, a thermosetting epoxy resin with a thickness of 2 μm is used for the adhesion layer 313a and a base made of PET is used for the base film 313b.

After the flexible base 313 is attached, the UV peeling tape 440 is irradiated with UV light, and the UV peeling tape 440 is peeled off from the sealing layer 314. By the foregoing, the semiconductor device 301 shown in FIG. 13 is completed.

The thickness of the semiconductor device 301 of this embodiment is as follows. The flexible base 313 has a thickness of 6 μm, and a portion of the element layer 321 in which the circuit portion 312 is formed (from a bottom surface of the silicon oxide film 403 to a top surface of the polyimide 435) has a thickness of about 3 μm. Also, the antenna 311 has a thickness of 5 μm and the sealing layer 314 sealing the antenna 311 has a thickness of about 15 μm. Accordingly, by this embodiment, the thickness of the semiconductor device 301 can be made to be 30 μm or less, and as thin as about 25 μm. In this embodiment, although the thickness of the sealing layer 314 is 15 μm, the sealing layer 314 can be thinned to a thickness that is about 20% to 30% thicker than 5 μm, which is the thickness of the antenna 311 (6 μm or more and 6.5 μm or less).

This application is based on Japanese Patent Application serial no. 2006-175678 filed in Japan Patent Office on June 26 in 2006, the entire contents of which are hereby incorporated by reference.

EXPLANATION OF REFERENCE

1: semiconductor device, 2: paper, 11: antenna, 12: circuit portion, 13: flexible base, 14: sealing layer, 21: element layer, 22: stacked-layer body, 23 to 26: insulating film, 31: substrate, 32: peeling layer, 33: semiconductor film, 34: first conductive layer, 35: impurity region, 36: channel formation region, 37: second conductive layer, 40: opening portion, 41: supporting base, 51 and 52: wet paper web, 53: paper layer, 54: paper layer, 60: power supply portion, 61: signal processing portion, 62: rectifying circuit, 63: storage capacitor, 64: demodulation circuit, 65: clock generation/correction circuit, 66: recognition/determination circuit, 67: memory controller, 68: mask ROM, 69: encoding circuit, 70: modulation circuit, 76: CPU interface, 77: control register, 78: code extraction circuit, 79: encoding circuit, 80: arithmetic circuit, 81: analog portion, 82: CPU, 83: ROM, 83a: secret key, 84: RAM, 85: controller, 88: resonance circuit, 89: power supply circuit, 90: reset circuit, 91: clock generation circuit, 92: demodulation circuit, 93: modulation circuit, 94: power supply management circuit, 96: reception signal, 96a: ciphertext data, 97: transmission signal, 97a: decoded text data, 98: reception data, 99: transmission data, 111: bearer bond, 112: certificate, 113: label base, 114: label, 115: box, 116: tag, 117: book, 125 and 126: wet paper web, 127: filter paper, 128: stage, 129: pressing plate, 130 and 131: paper layer, 132: multilayered paper, 301: semiconductor device, 311: antenna, 312: circuit portion, 313: flexible base, 313a: adhesion layer, 313b: base film, 314: sealing layer, 321: element layer, 322: stacked-layer body, 400: glass substrate, 401: silicon oxynitride film, 402: tungsten film, 403: silicon oxide film, 404: silicon oxynitride film, 405: silicon oxynitride film, 406: crystalline silicon film, 407 to 409: semiconductor layer, 407a and 407b: p-type high concentration impurity region, 407c: channel formation region, 408a and 408b: n-type high concentration impurity region, 408c: channel formation region, 408d and 408e: n-type low concentration impurity regions, 409a and 409b: n-type high concentration impurity region, 409c: channel formation region, 409e and 409d: n-type low concentration impurity region, 410: silicon oxynitride film, 412: n-type impurity region, 413 to 415: first conductive layer, 416 to 419: n-type low concentration impurity region, 423 to 425: insulating layers, 426: silicon oxynitride film, 427: silicon oxynitride film, 428 to 433: second conductive layer, 435: polyimide, 436: conductive layer, 437: polyimide, 439: opening portion, 440: UV peeling tape.

What is claimed is:

1. A method of manufacturing paper including a semiconductor device, comprising the steps of:
   providing a semiconductor device over a first wet paper web;
   laminating a second wet paper web over the first wet paper web and the semiconductor device;
   pressing the first and second wet paper webs; and
   drying the first and second wet paper webs, wherein an object that can change in shape is in contact with one surface of one of the first and second wet paper webs when pressing the first and second wet paper webs.

2. The method of manufacturing paper including a semiconductor device according to claim 1, wherein the object that can change in shape is a filter paper.

3. The method of manufacturing paper including a semiconductor device according to claim 1, further comprising the step of spraying an interlayer reinforcer over one surface of one of the first and second wet paper webs before laminating the second wet paper web.

4. The method of manufacturing paper including a semiconductor device according to claim 3, wherein the interlayer reinforcer is phosphate-esterified starch or cationic polyacrylamide.

5. A method of manufacturing paper including a semiconductor device, comprising the steps of:
providing a semiconductor device over a first wet paper web;
laminating a second wet paper web over the first wet paper web and the semiconductor device;
pressing the first and second wet paper webs; and
drying the first and second wet paper webs,
wherein an object that can change in shape is in contact with one surface of each of the first and second wet paper webs when pressing the first and second wet paper webs.

6. The method of manufacturing paper including a semiconductor device according to claim 5, wherein the object that can change in shape is a filter paper.

7. The method of manufacturing paper including a semiconductor device according to claim 5, further comprising the step of spraying an interlayer reinforcer over one surface of one of the first and second wet paper webs before laminating the second wet paper web.

8. The method of manufacturing paper including a semiconductor device according to claim 7, wherein the interlayer reinforcer is phosphate-esterified starch or cationic polyacrylamide.

9. A method of manufacturing paper including a semiconductor device, comprising the steps of:
providing a semiconductor device over a first wet paper web;
modifying a surface of the semiconductor device to have a hydrophilic property;
laminating a second wet paper web over the first wet paper web and the semiconductor device;
pressing the first and second wet paper webs; and
drying the first and second wet paper webs,
wherein an object that can change in shape is in contact with one surface of one of the first and second wet paper webs when pressing the first and second wet paper webs.

10. The method of manufacturing paper including a semiconductor device according to claim 9, wherein the surface of the semiconductor device is modified by a plasma treatment or a corona treatment.

11. The method of manufacturing paper including a semiconductor device according to claim 9, wherein the object that can change in shape is a filter paper.

12. The method of manufacturing paper including a semiconductor device according to claim 9, further comprising the step of spraying an interlayer reinforcer over one surface of one of the first and second wet paper webs.

13. The method of manufacturing paper including a semiconductor device according to claim 12, wherein the interlayer reinforcer is phosphate-esterified starch or cationic polyacrylamide.

* * * * *

UNITED STATES PATENT AND TRADEMARK OFFICE
CERTIFICATE OF CORRECTION

| | | |
|---|---|---|
| PATENT NO. | : 7,879,654 B2 | |
| APPLICATION NO. | : 12/694505 | |
| DATED | : February 1, 2011 | |
| INVENTOR(S) | : Yoshitaka Dozen et al. | |

It is certified that error appears in the above-identified patent and that said Letters Patent is hereby corrected as shown below:

At column 2, line 50, "RFLD" should be -- RFID --;

At column 8, line 6, "fowled" should be -- formed --;

At column 8, line 46, "faulted" should be -- formed --;

At column 9, line 23, "fowling" should be -- forming --;

At column 9, line 51, "fowled" should be -- formed --;

At column 10, line 19, "fanning" should be -- forming --;

At column 10, line 61, "fowl" should be -- form --;

At column 13, line 44, "RE tag" should be -- RF tag --;

At column 20, line 50, "form" should be -- forms --;

At column 21, line 39, "p-channel" should be -- p-channel TFT --;

At column 22, line 57, "faulted" should be -- formed --;

At column 23, line 28, "fondled" should be -- formed --;

At column 23, line 45, "fanned" should be -- formed --.

Signed and Sealed this

Nineteenth Day of April, 2011

David J. Kappos
*Director of the United States Patent and Trademark Office*